(12) United States Patent
Shokrollahi et al.

(10) Patent No.: US 7,711,068 B2
(45) Date of Patent: *May 4, 2010

(54) MULTI-STAGE CODE GENERATOR AND DECODER FOR COMMUNICATION SYSTEMS

(75) Inventors: M. Amin Shokrollahi, Preverenges (CH); Soren Lassen, San Francisco, CA (US); Michael Luby, Berkeley, CA (US)

(73) Assignee: Digital Fountain, Inc., San Diego, CA (US)

( * ) Notice: Subject to any disclaimer, the term of this patent is extended or adjusted under 35 U.S.C. 154(b) by 235 days.

This patent is subject to a terminal disclaimer.

(21) Appl. No.: 11/842,047

(22) Filed: Aug. 20, 2007

(65) Prior Publication Data
US 2008/0309525 A1    Dec. 18, 2008

Related U.S. Application Data

(63) Continuation of application No. 11/354,256, filed on Feb. 13, 2006, which is a continuation of application No. 10/032,156, filed on Dec. 21, 2001, now Pat. No. 7,068,729.

(51) Int. Cl.
*H04K 1/02* (2006.01)
(52) U.S. Cl. .................................. 375/296; 714/758
(58) Field of Classification Search .................. 341/50, 341/52; 375/296; 714/758
See application file for complete search history.

(56) References Cited

U.S. PATENT DOCUMENTS 3,909,721 A    9/1975    Bussgang et al.
4,365,338 A    12/1982   McRae et al.
4,589,112 A    5/1986    Karim
5,331,320 A    7/1994    Cideciyan et al.
5,432,787 A    7/1995    Chethik (Continued)

FOREIGN PATENT DOCUMENTS

| EP | 0854650 | 7/1998 |
| WO | 9634463 | 10/1996 |
| WO | 9832231 | 7/1998 |
| WO | 0018017 | 3/2000 |

OTHER PUBLICATIONS

Alon, N. et al.: "Linear Time Erasure Codes with Nearly Optimal Recovery (Extended Abstract." Proceedings of the Annual Symposium on Foundations of Computer Science. US, Los Alamitos. IEEE Comp. Soc. Press. vol. Symp. 36, pp. 512-516 (Oct. 23, 1995) XP000557871.

(Continued)

*Primary Examiner*—Kevin Y Kim
(74) *Attorney, Agent, or Firm*—Jeffrey D. Jacobs

(57) ABSTRACT

A method of encoding data for transmission from a source to a destination over a communications channel is provided. A plurality of redundant symbols are generated from an ordered set of input symbols to be transmitted. A plurality of output symbols are generated from a combined set of symbols including the input symbols and the redundant symbols, wherein the number of possible output symbols is much larger than the number of symbols in the combined set of symbols, wherein at least one output symbol is generated from more than one symbol in the combined set of symbols and from less than all of the symbols in the combined set of symbols, and such that the ordered set of input symbols can be regenerated to a desired degree of accuracy from any predetermined number, N, of the output symbols.

24 Claims, 20 Drawing Sheets

U.S. PATENT DOCUMENTS

| | | | |
|---|---|---|---|
| 5,455,823 | A | 10/1995 | Noreen et al. |
| 5,608,738 | A | 3/1997 | Matsushita |
| 5,617,541 | A | 4/1997 | Albanese et al. |
| 5,805,825 | A | 9/1998 | Danneels et al. |
| 5,933,056 | A | 8/1999 | Rothenberg |
| 5,953,537 | A | 9/1999 | Balicki et al. |
| 5,970,098 | A | 10/1999 | Herzberg |
| 5,983,383 | A | 11/1999 | Wolf |
| 6,044,485 | A | 3/2000 | Dent et al. |
| 6,073,250 | A | 6/2000 | Luby et al. |
| 6,081,909 | A | 6/2000 | Luby et al. |
| 6,081,918 | A | 6/2000 | Spielman |
| 6,097,320 | A | 8/2000 | Kuki et al. |
| 6,163,870 | A | 12/2000 | Luby et al. |
| 6,178,536 | B1 | 1/2001 | Sorkin |
| 6,195,777 | B1 | 2/2001 | Luby et al. |
| 6,223,324 | B1 | 4/2001 | Sinha et al. |
| 6,307,487 | B1 | 10/2001 | Luby |
| 6,320,520 | B1 | 11/2001 | Luby |
| 6,333,926 | B1 | 12/2001 | Van Heeswyk et al. |
| 6,373,406 | B2 | 4/2002 | Luby |
| 6,411,223 | B1 | 6/2002 | Haken et al. |
| 6,420,982 | B1 | 7/2002 | Brown |
| 6,430,233 | B1 | 8/2002 | Dillon et al. |
| 6,473,010 | B1 | 10/2002 | Vityaev et al. |
| 6,486,803 | B1 | 11/2002 | Luby et al. |
| 6,643,332 | B1 | 11/2003 | Morelos-Zaragoza et al. |
| 6,742,154 | B1 | 5/2004 | Barnard |
| 6,849,803 | B1 | 2/2005 | Gretz |
| 6,850,736 | B2 | 2/2005 | McCune |
| 6,856,263 | B2 | 2/2005 | Shokrollahi et al. |
| 6,909,383 | B2 | 6/2005 | Shokrollahi et al. |
| 7,030,785 | B2 | 4/2006 | Shokrollahi et al. |
| 7,068,729 | B2 | 6/2006 | Shokrollahi et al. |
| 7,418,651 | B2 | 8/2008 | Luby et al. |
| 2007/0195894 | A1 | 8/2007 | Shokrollahi et al. |
| 2007/0300127 | A1 | 12/2007 | Watson et al. |

OTHER PUBLICATIONS

Bigloo, A. et al.: "A Robust Rate-Adaptive Hybrid ARQ Scheme and Frequency Hopping for Multiple-Access Communication Systems," IEEE Journal on Selected Areas in Communications. US, IEEE Inc. New York (Jun. 6, 2001) pp. 917-1624 XP0000464977.

Bitner, J.R., et al.: "Efficient generation of the binary reflected Gray code and its Applications." Communications of the ACM (1976).

Biomer, J. et al., "An XOR-Based Erasure-Resilient Coding Scheme," ICSI Technical Report No. TR-95-048 (1995).

Digital Fountain. "Raptor code specification for MBMS file download," 3GPP SA4 PSM AD-HOC #31 (May 21, 2004) XP002355055 pp. 1-6.

Digital Fountain: "Specification Text for Raptor Forward Error Correction." TDOC S4-050249 of 3GPP TSG SA WA 4 Meeting #34 [Online] (Feb. 25, 2005) pp. 1-23. XP002425167. Retrieved from the Internet: URL: http://www.3gpp.org/ftp/tsg_sa/WG4_CODEC/TSGS4_34/Docs.

Esaki, et al.: "Reliable IP Multicast Communication Over ATM Networks Using Forward Error Correction Policy." IEICE Transactions on Communications, JP, Institute of Electronics Information and Comm. ENG. Tokyo, vol. E78-V. No. 12 (Dec. 1, 1995) pp. 1622-1637.

Gemmell, et al., "A Scalable Multicast Architecture for One-to-Many Telepresentations", Multimedia Computing and Systems, 1998/Proceedings. IEEE International Conference on Austin, TX, USA Jun. 28-Jul. 1, 1998, Los Alamitos, CA USA, IEEE Comput. Soc, US.

Hershey, et al., "Random Parity Coding (RPC)", 1996 IEEE International Conference on Communications (ICC), Converging Technologies for Tomorrows Applications, Dallas. Jun. 23-27, 1996. IEEE International Conference on Communications (ICC), New York, IEEE.

Kallel, "Complementary Punctured Convolutional (CPC) Codes and Their Applications" IEEE Transactions on Communications, IEEE Inc., New York, US, vol. 43, No. 6, Jun. 1, 1995, pp. 2005-2009.

Luby, M. et al.: "Analysis of Random Processes via And-Or Tree Evaluation." ICSI Technical Report No. TR-97-042 (1997) and Proceedings of the 9th Annual ACM Symposium on Discrete Algorithms (1998).

Luby, M. et al.; "Improved Low-Density Parity-Check Codes Using Irregular Graphs and Belief Propagation," International Computer Science Institute Technical Report TR-97-044 (Nov. 1997).

Luby, M. et al.: "Practical Loss-Resilient Codes: Tornado Codes," 29th Annual ACM Symposium on Theory of Computing (1997).

Narayanan et al., "Physical Layer Design for Packet Data Over IS-136", Vehicular Technology Conference, 1997, IEEE 47th Pheonix, AZ, USA May 4-7, 1997, New York, NY, USA, IEEE, US May 4, 1997, pp. 1029-1033.

Nonnenmacher, et al., "Party-Based Loss-Recovery for Release Multicast Transmission". IEEE / ACM Transactions on Networking IEEE Inc, New York. US. vol. 6, No. 4, Aug. 1, 1998, pp. 349-361.

Pursley, M. et al.: "A Correction and an Addendum for Variable-Rate Coding for Meteor-Burst Communications," IEEE Transactions on Communications, vol. 43, No. 12 pp. 2866-2867 (Dec. 1995).

Pursley, M. et al.: "Variable-Rate Coding For Meteor-Burst Communications," IEEE Transactions on Communications, vol. 37, No. 11, pp. 1105-1112 (Nov. 1989) XP000074533 ISSN: 0090-6778.

Seshan, S. et al.: "Handoffs in Cellular Wireless Networks: The Daedalus Implementation and Experience," Wireless Personal Communications. NL: Kluwer Scademic Publishers: vol. 4, No. 2 (Mar. 1, 1997) pp. 141-162, XP000728589.

Shacham, N., "Packet Recovery and Error Correction in High-Speed Wide-Area Newtworks," Proceedings of the Military Communications Conferences (Milcom), US, New York, IEEE, vol. 1, pp. 551-557 (1989) XP000131876.

Shokrollhai, A.: "Raptor Codes," Internet Citation [Online] (Jan. 13, 2004) XP002367883, Retrieved from the Internet; URL http://www.cs.huji.ac.il/labs/danss/p2p/resources/raptor.pdf.

Shokrollhai, A.: "Raptor Codes" Internet Citation [Online] (Jan. 13, 2004) XP002367883, Retrieved from the Internet: URL:http://www.cs.huji.ac.il/labs/danss/p2p/resources/raptor.pdf.

Byers, et al., "A Digital Fountain Approach to Reliable Distribution of Bulk Data", 1988, Computer Communications Review, Association for Computing Machinery, vol. 28, No. 4, pp. 56-67.

Byers, et al., "Accessing multiple mirror sites in parallel: Using Tornado Codes to Speed Up Downloads", 1999, Eighteenth Annual Joint Conference of the IEEE Computer and Communications Societies. pp. 275-283.

Clark, et al., "Error Correction Coding for Digital Communications, Systems Applications", 1981, Pienum Press, New York, pp. 339-341.

Luby, et al., "Analysis of Low Density Codes and Improved Designs Using Irregular Graphs". 1998. Proceedings of the 30th Annual ACM Symposium on Theory of Computing, 1998, pp. 249-258.

Luby, et al., "Efficient Earsure Correcting Codes", 2001, IEEE Transactions on Information Theory, vol. 47, No. 2, pp. 56-584.

Rizzo, "Effective Erasure Codes for Reliable Computer Communication Protocols", Computer Communication Review, Association for Computing Machinery, vol. 27, No. 2, pp. 24-36.

Shu, et al., "Error Control Coding-Fundamentals and Applications", 1983, Englewood Cliffs, pp. 288.

International Search Report—PCT/US02-041615—ISA/US—Mar. 26, 2003.

International Preliminary Examination Report—PCT/US02/041615—IPEA/US—May 12, 2004.

Supplementary European Search Report—EP02794439—Search Authority—The Hague—Jan. 13, 2005.

US 7,711,068 B2

MULTI-STAGE CODE GENERATOR AND DECODER FOR COMMUNICATION SYSTEMS

CROSS-REFERENCE TO RELATED APPLICATIONS

This is a continuation application of U.S. patent application Ser. No. 11/354,256, filed Feb. 13, 2006 which is a continuation application of U.S. patent application Ser. No. 10/032,156 filed Dec. 21, 2001, now U.S. Pat. No. 7,068,729, issued Jun. 27, 2006 entitled "Multi-Stage Code Generator and Decoder for Communication Systems," which is herein incorporated by reference in its entirety for all purposes.

BACKGROUND OF THE INVENTION

The present invention relates to encoding and decoding data in communications systems and more specifically to communication systems that encode and decode data to account for errors and gaps in communicated data.

Transmission of files between a sender and a recipient over a communications channel has been the subject of much literature. Preferably, a recipient desires to receive an exact copy of data transmitted over a channel by a sender with some level of certainty. Where the channel does not have perfect fidelity (which covers most all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors. Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected a simple parity code might be best.

Another consideration in selecting a code is the protocol used for transmission. In the case of the global internetwork of networks known as the "Internet" (with a capital "I"), a packet protocol is used for data transport. That protocol is called the Internet Protocol or "IP" for short. When a file or other block of data is to be transmitted over an IP network, it is partitioned into equal size input symbols and input symbols are placed into consecutive packets. The "size" of an input symbol can be measured in bits, whether or not the input symbol is actually broken into a bit stream, where an input symbol has a size of M bits when the input symbol is selected from an alphabet of $2^M$ symbols. In such a packet-based communication system, a packet oriented coding scheme might be suitable. A transmission is called reliable if it allows the intended recipient to recover an exact copy of the original file even in the face of erasures in the network. On the Internet, packet loss often occurs because sporadic congestion causes the buffering mechanism in a router to reach its capacity, forcing it to drop incoming packets. Protection against erasures during transport has been the subject of much study.

The Transport Control Protocol ("TCP") is a point-to-point packet control scheme in common use that has an acknowledgment mechanism. TCP is good for one-to-one communications, where the sender and recipient both agree on when the transmission will take place and be received and both agree on which transmitters and receivers will be used. However, TCP is often not suitable for one-to-many or many-to-many communications or where the sender and the recipient independently determine when and where they will transmit or receive data.

Using TCP, a sender transmits ordered packets and the recipient acknowledges receipt of each packet. If a packet is lost, no acknowledgment will be sent to the sender and the sender will resend the packet. Packet loss has a number of causes. With protocols such as TCP/IP, the acknowledgment paradigm allows packets to be lost without total failure, since lost packets can just be retransmitted, either in response to a lack of acknowledgment or in response to an explicit request from the recipient. Either way, an acknowledgment protocol requires a back channel from the recipient to the sender that is used heavily at times when the number of lost packets is large.

Although acknowledgment-based protocols are generally suitable for many applications and are in fact widely used over the current Internet, they are inefficient, and sometimes completely infeasible, for certain applications as such as those described in U.S. Pat. No. 6,307,487 issued to Michael G. Luby entitled "Information Additive Code Generator and Decoder for Communication Systems" (hereinafter "Luby I"). Furthermore, acknowledgment-based protocols do not scale well to broadcasting, where one sender is sending a file simultaneously to multiple users. For example, suppose a sender is broadcasting a file to multiple recipients over a satellite channel. Each recipient may experience a different pattern of packet loss. Protocols that rely on acknowledgment data (either positive or negative) for reliable delivery of the file require a back channel from each recipient to the sender, and this can be prohibitively expensive to provide. Furthermore, this requires a complex and powerful sender to be able to properly handle all of the acknowledgment data sent from the recipients. Another drawback is that if different recipients lose different sets of packets, rebroadcast of packets missed only by a few of the recipients causes reception of useless duplicate packets by other recipients.

An alternative to an acknowledgment-based protocol that is sometimes used in practice is a carousel-based protocol. A carousel protocol partitions an input file into equal length input symbols, places each input symbol into a packet, and then continually cycles through and transmits all the packets. A major drawback with a carousel-based protocol is that if a recipient misses even one packet, then the recipient has to wait another entire cycle before having a chance at receiving the missed packet. Another way to view this is that a carousel-based protocol can cause a large amount of useless duplicate data reception. For example, if a recipient receives packets from the beginning of the carousel, stops reception for a while, and then starts receiving again at the beginning of the carousel, a large number of useless duplicate packets are received.

One solution that has been proposed to solve the above problems is to avoid the use of an acknowledgment-based protocol, and instead use Forward Error-Correction (FEC) codes, such as Reed-Solomon codes or Tornado codes, or chain reaction codes which are information additive codes, to increase reliability. With these codes, output symbols are generated from the content and sent instead of just sending the input symbols that constitute the content. Erasure correcting codes, such as Reed-Solomon or Tornado codes, generate a fixed number of output symbols for a fixed length content. For example, for K input symbols, N output symbols might be generated. These N output symbols may comprise the K original input symbols and N-K redundant symbols. If storage permits, then the server can compute the set of output symbols for each content only once and transmit the output symbols using a carousel protocol.

One problem with some FEC codes is that they require excessive computing power or memory to operate. Another problem is that the number of output symbols must be determined in advance of the coding process. This can lead to inefficiencies if the loss rate of packets is overestimated, and can lead to failure if the loss rate of packets is underestimated.

For traditional FEC codes, the number of possible output symbols that can be generated is of the same order of magnitude as the number of input symbols the content is partitioned into. Typically, most or all of these output symbols are generated in a preprocessing step before the sending step. These output symbols have the property that all the input symbols can be regenerated from any subset of the output symbols equal in length to the original content or slightly longer in length than the original content.

Embodiments described in Luby I (referred to herein as "chain reaction codes") provide a different form of forward error-correction that addresses the above issues. For chain reaction codes, the pool of possible output symbols that can be generated is typically orders of magnitude larger than the number of the input symbols, and a random output symbol from the pool of possibilities can be generated very quickly. For chain reaction codes, the output symbols can be generated on the fly on an as needed basis concurrent with the sending step. Chain reaction codes have the property that all input symbols of the content can be regenerated from any subset of a set of randomly generated output symbols slightly longer in length than the original content.

In one embodiment of a chain reaction code, each output symbol is obtained as the Exclusive-Or (XOR, denoted by $\oplus$) of some of the input symbols. If K denotes the total number of input symbols, then each output symbol is, on average, the XOR of $c*\ln(K)$ input symbols, where $\ln(K)$ is the natural logarithm of K and c is a suitable constant. For example, where K is 60,000, each output symbol is the XOR of, on average, 28.68 input symbols, and where K is 10,000, each output symbol is the XOR of, on average, 22.86 input symbols. A large number of XOR's results in a longer computation time of the output symbols as each such operation involves fetching data from memory, performing the XOR operation, and updating memory locations.

One property of the output symbols produced by a chain reaction encoder is that a receiver is able to recover the original file as soon as enough output symbols have been received. Specifically, to recover the original K input symbols with a high probability, the receiver needs approximately K+A output symbols. The ratio A/K is called the "relative reception overhead." The relative reception overhead depends on the number K of input symbols, and on the reliability of the decoder. For example, in one specific embodiment, and where K is equal to 60,000, a relative reception overhead of 5% ensures that the decoder successfully decodes the input file with a probability of at least $1-10^{-8}$, and where K is equal to 10,000, a relative reception overhead of 15% ensures the same success probability of the decoder. In one embodiment, the relative reception overhead of chain reaction codes can be computed as $(13*\mathrm{sqrt}(K)+200)/K$, where $\mathrm{sqrt}(K)$ is the square root of the number of input symbols K. In this embodiment the relative reception overhead of chain reaction codes tends to be larger for small values of K.

In embodiments in which output symbols are encoded using the XOR function, a chain reaction decoder's main computational operation is performing XOR's of memory locations. The number of such XOR's scales in the same way as for the chain reaction encoder.

Chain reaction codes are extremely useful for communication over a packet based network. However, they can be fairly computationally intensive. For example, in some specific embodiments of chain reaction codes, when the number of input symbols K is 60,000, then computation of each output symbols requires fetching, on average, 28.68 randomly selected input symbols and XOR'ing them. Because the number of files that can be simultaneously served by a server is inversely proportional to the number of operations needed for every output symbol, it would be useful to decrease the number of operations needed for every output symbol. Decreasing the latter by a factor of say, three, increases the number of files that can be simultaneously served from one server by a factor of three.

Another property of chain reaction codes is that they require a reception overhead that can be relatively large for a given target success probability. For example, as pointed out above, in some specific embodiments of chain reaction codes, if K is 10,000, then a relative reception overhead of 15% ensures a decoding success probability of at least $1-10^{-8}$. The reception overhead tends to increase for smaller K. For example, in some specific embodiments of chain reaction codes, if K is 1000, a relative reception overhead of 61% ensures successful decoding with the same probability. Moreover, decreasing the target error probability to a number around $10^{-12}$, as required by certain applications such as high speed transmission of content over a satellite network, calls for an even larger reception overhead.

BRIEF SUMMARY OF THE INVENTION

According to one embodiment of the invention, a method of encoding data for transmission from a source to a destination over a communications channel is provided. The method operates on an ordered set of input symbols and includes generating a plurality of redundant symbols from the input symbols. The method also includes generating a plurality of output symbols from a combined set of symbols including the input symbols and the redundant symbols, wherein the number of possible output symbols is much larger than the number of symbols in the combined set of symbols, wherein at least one output symbol is generated from more than one symbol in the combined set of symbols and from less than all of the symbols in the combined set of symbols, and such that the ordered set of input symbols can be regenerated to a desired degree of accuracy from any predetermined number of the output symbols.

According to another embodiment of the invention, a system for encoding data for transmission from a source to a destination over a communications channel is provided. The system comprises a static encoder coupled to receive a plurality of input symbols, the plurality of input symbols generated from data to be transmitted. The static encoder includes a redundant symbol generator that generates a plurality of redundant symbols based on the input symbols. The system additionally comprises a dynamic encoder coupled to receive the plurality of input symbols and the plurality of redundant symbols. The dynamic encoder includes an output symbol generator that generates a plurality of output symbols from a combined set of symbols including the plurality of input symbols and the plurality of redundant symbols, wherein the number of possible output symbols is much larger than the number of symbols in the combined set, wherein at least one output symbol is generated from more than symbol from the combined set and from less than all of the symbols in the combined set, and such that the ordered set of input symbols can be regenerated to a desired degree of accuracy from any predetermined number of the output symbols.

According to yet another embodiment of the invention, a method of receiving data transmitted from a source over a communications channel is provided. The method includes receiving output symbols, wherein each output symbol is generated from at least one symbol in a combined set of input symbols and redundant symbols, wherein at least one output symbol is generated from more than one symbol in the combined set and less than all of the symbols in the combined set, wherein the number of possible output symbols is much larger than the number of symbols in the combined set, wherein the input symbols are from an ordered set of input symbols, and wherein the redundant symbols are generated from the input symbols. The method also includes upon receiving any predetermined number, N, of the output symbols, regenerating at least a subset of the symbols in the combined set from the N output symbols, the subset including a plurality of regenerated input symbols and a plurality of regenerated redundant symbols. The method further includes, if the step of regenerating at least a subset of the symbols from the N output symbols does not regenerate the input symbols to a desired degree of accuracy, regenerating at least some of unregenerated input symbols from the plurality of regenerated redundant symbols and/or some of the plurality of regenerated input symbols.

According to still another embodiment of the invention, a system for receiving data transmitted from a source over a communications channel is provided. The system comprises a receive module coupled to a communications channel for receiving output symbols transmitted over the communications channel, wherein each output symbol is generated from at least one symbol in a combined set of input symbols and redundant symbols, wherein at least one output symbol is generated from more than one symbol in the combined set and less than all of the symbols in the combined set, wherein the number of possible output symbols is much larger than the number of symbols in the combined set, wherein the input symbols are from an ordered set of input symbols, wherein the redundant symbols are generated from the input symbols. The system additionally comprises a dynamic decoder that, upon receiving a predetermined number, N, of the output symbols, decodes a subset of the symbols in the combined set from the N output symbols, the subset including a plurality of decoded input symbols and a plurality of decoded redundant symbols. The system further comprises a static decoder that decodes at least some of undecoded input symbols, if any, from the plurality of decoded redundant symbols.

According to yet another embodiment of the invention, a computer data signal embodied in a carrier wave is provided. The computer data signal includes a plurality of output symbols, wherein the plurality of output symbols represents symbols generated from a combined set of symbols including an ordered set of input symbols and the redundant symbols, wherein the redundant symbols are generated from the input symbols, wherein the number of possible output symbols is much larger than the number of symbols in the combined set of symbols, wherein at least one output symbol is generated from more than one symbol in the combined set of symbols and from less than all of the symbols in the combined set of symbols, and such that a receiver of the data signal can regenerate the ordered set of input symbols to a desired degree of accuracy from any predetermined number of the output symbols.

Numerous benefits are achieved by way of the present invention. For example, in a specific embodiment, the computational expense of encoding data for transmission over a channel is reduced. In another specific embodiment, the computational expense of decoding such data is reduced. Depending upon the embodiment, one or more of these benefits may be achieved. These and other benefits are provided in more detail throughout the present specification and more particularly below.

A further understanding of the nature and the advantages of the inventions disclosed herein may be realized by reference to the remaining portions of the specification and the attached drawings.

DETAILED DESCRIPTION OF SPECIFIC EMBODIMENTS

Figure 1:
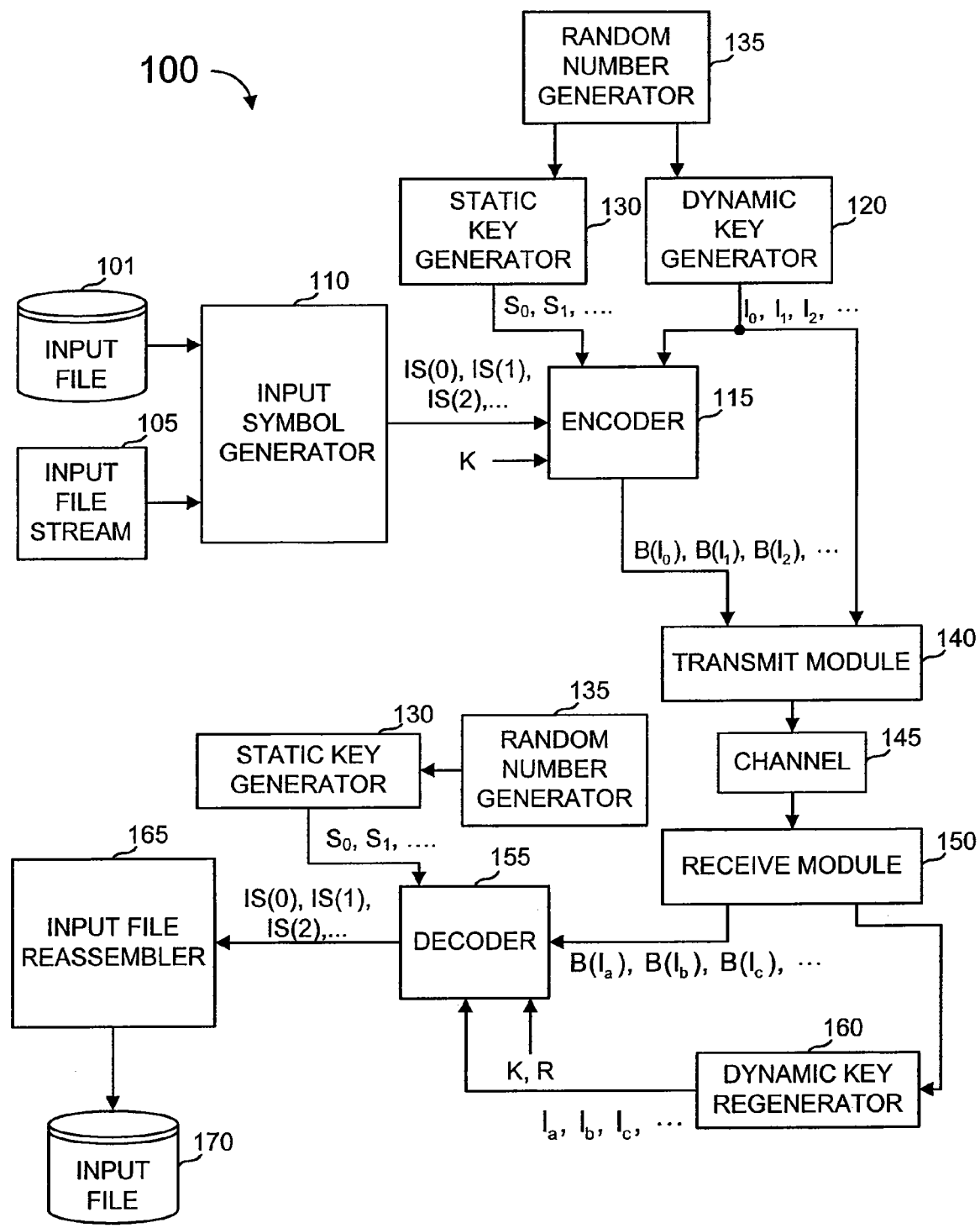
FIG. 1 is a block diagram of a communications system according to one embodiment of the present invention.

The present disclosure references U.S. Pat. No. 6,307,487 (Luby I), and U.S. Pat. No. 6,320,520 issued to Michael G. Luby entitled "Information Additive Group Code Generator and Decoder for Communication Systems" (hereinafter "Luby II"), the entire disclosures of which are herein incorporated by reference for all purposes. Luby I and Luby II provide teachings of systems and methods that can be employed in certain embodiments according to the present invention. It is to be understood, however, that these systems and methods are not required of the present invention, and many other variations, modifications, or alternatives can also be used.

In the specific embodiments described herein, a coding scheme denoted as "multi-stage coding" is described, preceded by an explanation of the meaning and scope of various terms used in this description.

Multi-stage encoding, as described herein, encodes the data in a plurality of stages. Typically, but not always, a first stage adds a predetermined amount of redundancy to the data. A second stage then uses a chain reaction code, or the like, to produce output symbols from the original data and the redundant symbols computed by the first stage of the encoding. In one specific embodiment of the present invention, the received data is first decoded using a chain reaction decoding process. If that process is not successful in recovering the original data completely, a second decoding step can be applied.

One advantage of some embodiments described herein, is that fewer arithmetic operations are necessary to produce output symbols, as compared to chain reaction coding alone, as will be described below. Another advantage of some specific embodiments that include a first stage of encoding and a second stage of encoding is that the first stage of encoding and the second stage of encoding can be done at separate times and/or by separate devices, thus partitioning the computational load. This can be an advantage, for instance, if it is desired to perform a portion of the encoding substantially concurrently with the transmission. Particularly, the first stage of encoding can be performed well in advance of the transmission, while the second stage of encoding can be performed substantially concurrently with the transmission. It is to be understood however, that in some embodiments, the first and second stages of encoding can both be performed substantially concurrently with transmission, and/or with one device. Many other variations, modifications, and alternatives will be apparent to those skilled in the art after review of this disclosure.

In embodiments of multi-stage encoding, redundant symbols are generated from the input file during the first stage of encoding. In these embodiments, in the second stage of encoding, output symbols are generated from the combination of the input file and the redundant symbols. In some of these embodiments, the output symbols can be generated as needed. In embodiments in which the second stage comprises chain reaction encoding, each output symbol can be generated without regard to how other output symbols are generated. Once generated, these output symbols can then be placed into packets and transmitted to their destination, with each packet containing one or more output symbols. Non-packetized transmission techniques can be used instead or as well.

As used herein, the term "file" refers to any data that is stored at one or more sources and is to be delivered as a unit to one or more destinations. Thus, a document, an image, and a file from a file server or computer storage device, are all examples of "files" that can be delivered. Files can be of known size (such as a one megabyte image stored on a hard disk) or can be of unknown size (such as a file taken from the output of a streaming source). Either way, the file is a sequence of input symbols, where each input symbol has a position in the file and a value.

Transmission is the process of transmitting data from one or more senders to one or more recipients through a channel in order to deliver a file. A sender is also sometimes referred to as the encoder. If one sender is connected to any number of recipients by a perfect channel, the received data can be an exact copy of the input file, as all the data will be received correctly. Here, we assume that the channel is not perfect, which is the case for most real-world channels. Of the many channel imperfections, two imperfections of interest are data erasure and data incompleteness (which can be treated as a special case of data erasure). Data erasure occurs when the channel loses or drops data. Data incompleteness occurs when a recipient does not start receiving data until some of the data has already passed it by, the recipient stops receiving data before transmission ends, the recipient chooses to only receive a portion of the transmitted data, and/or the recipient intermittently stops and starts again receiving data. As an example of data incompleteness, a moving satellite sender might be transmitting data representing an input file and start the transmission before a recipient is in range. Once the recipient is in range, data can be received until the satellite moves out of range, at which point the recipient can redirect its satellite dish (during which time it is not receiving data) to start receiving the data about the same input file being transmitted by another satellite that has moved into range. As should be apparent from reading this description, data incompleteness is a special case of data erasure, since the recipient can treat the data incompleteness (and the recipient has the same problems) as if the recipient was in range the entire time, but the channel lost all the data up to the point where the recipient started receiving data. Also, as is well known in communication systems design, detectable errors can be considered equivalent to erasures by simply dropping all data blocks or symbols that have detectable errors.

In some communication systems, a recipient receives data generated by multiple senders, or by one sender using multiple connections. For example, to speed up a download, a recipient might simultaneously connect to more than one sender to transmit data concerning the same file. As another example, in a multicast transmission, multiple multicast data streams might be transmitted to allow recipients to connect to one or more of these streams to match the aggregate transmission rate with the bandwidth of the channel connecting them to the sender. In all such cases, a concern is to ensure that all transmitted data is of independent use to a recipient, i.e., that the multiple source data is not redundant among the streams, even when the transmission rates are vastly different for the different streams, and when there are arbitrary patterns of loss.

In general, a communication channel is that which connects the sender and the recipient for data transmission. The communication channel could be a real-time channel, where the channel moves data from the sender to the recipient as the channel gets the data, or the communication channel might be a storage channel that stores some or all of the data in its transit from the sender to the recipient. An example of the latter is disk storage or other storage device. In that example, a program or device that generates data can be thought of as the sender, transmitting the data to a storage device. The recipient is the program or device that reads the data from the storage device. The mechanisms that the sender uses to get the data onto the storage device, the storage device itself and the mechanisms that the recipient uses to get the data from the storage device collectively form the channel. If there is a chance that those mechanisms or the storage device can lose data, then that would be treated as data erasure in the communication channel.

When the sender and recipient are separated by a communication channel in which symbols can be erased, it is preferable not to transmit an exact copy of an input file, but instead to transmit data generated from the input file that assists with recovery of erasures. An encoder is a circuit, device, module or code segment that handles that task. One way of viewing the operation of the encoder is that the encoder generates output symbols from input symbols, where a sequence of input symbol values represent the input file. Each input symbol would thus have a position, in the input file, and a value. A decoder is a circuit, device, module or code segment that reconstructs the input symbols from the output symbols received by the recipient. In multi-stage coding, the encoder and the decoder are further divided into sub-modules each performing a different task.

In embodiments of multi-stage coding systems, the encoder and the decoder can be further divided into sub-modules, each performing a different task. For instance, in some embodiments, the encoder comprises what is referred to herein as a static encoder and a dynamic encoder. As used herein, a "static encoder" is an encoder that generates a number of redundant symbols from a set of input symbols, wherein the number of redundant symbols is determined prior to encoding. Examples of static encoding codes include Reed-Solomon codes, Tornado codes, Hamming codes, Low Density Parity Check (LDPC) codes, etc. The term "static decoder" is used herein to refer to a decoder that can decode data that was encoded by a static encoder.

As used herein, a "dynamic encoder" is an encoder that generates output symbols from a set of input symbols, where the number of possible output symbols is orders of magnitude larger than the number of input symbols, and where the number of output symbols to be generated need not be fixed. One example of a dynamic encoder is a chain reaction encoder, such as the encoders described in Luby I and Luby II. The term "dynamic decoder" is used herein to refer to a decoder that can decode data that was encoded by a dynamic encoder.

Embodiments of multi-stage coding need not be limited to any particular type of input symbol. Typically, the values for the input symbols are selected from an alphabet of $2^M$ symbols for some positive integer M. In such cases, an input symbol can be represented by a sequence of M bits of data from the input file. The value of M is often determined based on, for example, the uses of the application, the communication channel, and/or the size of the output symbols. Additionally, the size of an output symbol is often determined based on the application, the channel, and/or the size of the input symbols. In some cases, the coding process might be simplified if the output symbol values and the input symbol values were the same size (i.e., representable by the same number of bits or selected from the same alphabet). If that is the case, then the input symbol value size is limited when the output symbol value size is limited. For example, it may be desired to put output symbols in packets of limited size. If some data about a key associated with the output symbols were to be transmitted in order to recover the key at the receiver, the output symbol would preferably be small enough to accommodate, in one packet, the output symbol value and the data about the key.

As an example, if an input file is a multiple megabyte file, the input file might be broken into thousands, tens of thousands, or hundreds of thousands of input symbols with each input symbol encoding thousands, hundreds, or only few bytes. As another example, for a packet-based Internet channel, a packet with a payload of size of 1024 bytes might be appropriate (a byte is 8 bits). In this example, assuming each packet contains one output symbol and 8 bytes of auxiliary information, an output symbol size of 8128 bits ($(1024-8)*8$) would be appropriate. Thus, the input symbol size could be chosen as $M=(1024-8)*8$, or 8128 bits. As another example, some satellite systems use the MPEG packet standard, where the payload of each packet comprises 188 bytes. In that example, assuming each packet contains one output symbol and 4 bytes of auxiliary information, an output symbol size of 1472 bits ($(188-4)*8$), would be appropriate. Thus, the input symbol size could be chosen as $M=(188-4)*8$, or 1472 bits. In a general-purpose communication system using multi-stage coding, the application-specific parameters, such as the input symbol size (i.e., M, the number of bits encoded by an input symbol), might be variables set by the application.

Each output symbol has a value. In one preferred embodiment, which we consider below, each output symbol also has associated therewith an identifier called its "key." Preferably, the key of each output symbol can be easily determined by the recipient to allow the recipient to distinguish one output symbol from other output symbols. Preferably, the key of an output symbol is distinct from the keys of all other output symbols. There are various forms of keying discussed in previous art. For example, Luby I describes various forms of keying that can be employed in embodiments of the present invention.

Multi-stage coding is particularly useful where there is an expectation of data erasure or where the recipient does not begin and end reception exactly when a transmission begins and ends. The latter condition is referred to herein as "data incompleteness." Regarding erasure events, multi-stage coding shares many of the benefits of chain reaction coding described in Luby I. In particular, multi-stage output symbols are information additive, so any suitable number of packets can be used to recover an input file to a desired degree of accuracy. These conditions do not adversely affect the communication process when multi-stage coding is used, because the output symbols generated with multi-stage coding are information additive. For example, if a hundred packets are lost due to a burst of noise causing data erasure, an extra hundred packets can be picked up after the burst to replace the loss of the erased packets. If thousands of packets are lost because a receiver did not tune into a transmitter when it began transmitting, the receiver could just pickup those thousands of packets from any other period of transmission, or even from another transmitter. With multi-stage coding, a receiver is not constrained to pickup any particular set of packets, so it can receive some packets from one transmitter, switch to another transmitter, lose some packets, miss the beginning or end of a given transmission and still recover an input file. The ability to join and leave a transmission without receiver-transmitter coordination helps to simplify the communication process.

In some embodiments, transmitting a file using multi-stage coding can include generating, forming or extracting input symbols from an input file, computing redundant symbols, encoding input and redundant symbols into one or more output symbols, where each output symbol is generated based on its key independently of all other output symbols, and transmitting the output symbols to one or more recipients over a channel. Additionally, in some embodiments, receiving (and reconstructing) a copy of the input file using multi-stage coding can include receiving some set or subset of output symbols from one of more data streams, and decoding the input symbols from the values and keys of the received output symbols.

Aspects of the invention will now be described with reference to the figures.

System Overview

FIG. 1 is a block diagram of a communications system 100 that uses multi-stage coding. In communications system 100, an input file 101, or an input stream 105, is provided to an input symbol generator 110. Input symbol generator 110 generates a sequence of one or more input symbols (IS(0), IS(1), IS(2), ...) from the input file or stream, with each input symbol having a value and a position (denoted in FIG. 1 as a parenthesized integer). As explained above, the possible values for input symbols, i.e., its alphabet, is typically an alphabet of $2^M$ symbols, so that each input symbol codes for M bits of the input file. The value of M is generally determined by the use of communication system 100, but a general purpose system might include a symbol size input for input symbol generator 110 so that M can be varied from use to use. The output of input symbol generator 110 is provided to an encoder 115.

Static key generator 130 produces a stream of static keys $S_0, S_1, \ldots$. The number of the static keys generated is generally limited and depends on the specific embodiment of encoder 115. The generation of static keys will be subsequently described in more detail. Dynamic key generator 120 generates a dynamic key for each output symbol to be generated by the encoder 115. Each dynamic key is generated so that a large fraction of the dynamic keys for the same input file are unique. For example, Luby I describes embodiments of key generators that can be used. The outputs of dynamic key generator 120 and the static key generator 130 are provided to encoder 115.

From each key I provided by dynamic key generator 120, encoder 115 generates an output symbol, with a value B(I), from the input symbols provided by the input symbol generator. The operation of encoder 115 will be described in more detail below. The value of each output symbol is generated based on its key, on some function of one or more of the input symbols, and possibly one or more redundant symbols that had been computed from the input symbols. The collection of input symbols and redundant symbols that give rise to a specific output symbol is referred to herein as the output symbol's "associated symbols" or just its "associates". The selection of the function (the "value function") and the associates is done according to a process described in more detail below. Typically, but not always, M is the same for input symbols and output symbols, i.e., they both code for the same number of bits.

In some embodiments, the number K of input symbols is used by the encoder 115 to select the associates. If K is not known in advance, such as where the input is a streaming file, K can be just an estimate. The value K might also be used by encoder 115 to allocate storage for input symbols and any intermediate symbols generated by encoder 115.

Encoder 115 provides output symbols to a transmit module 140. Transmit module 140 is also provided the key of each such output symbol from the dynamic key generator 120. Transmit module 140 transmits the output symbols, and depending on the keying method used, transmit module 140 might also transmit some data about the keys of the transmitted output symbols, over a channel 145 to a receive module 150. Channel 145 is assumed to be an erasure channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. The value of K, if used to determine the associates, can be sent over channel 145, or it may be set ahead of time by agreement of encoder 115 and decoder 155.

As explained above, channel 145 can be a real-time channel, such as a path through the Internet or a broadcast link from a television transmitter to a television recipient or a telephone connection from one point to another, or channel 145 can be a storage channel, such as a CD-ROM, disk drive, Web site, or the like. Channel 145 might even be a combination of a real-time channel and a storage channel, such as a channel formed when one person transmits an input file from a personal computer to an Internet Service Provider (ISP) over a telephone line, the input file is stored on a Web server and is subsequently transmitted to a recipient over the Internet.

Because channel 145 is assumed to be an erasure channel, communications system 100 does not assume a one-to-one correspondence between the output symbols that exit receive module 150 and the output symbols that go into transmit module 140. In fact, where channel 145 comprises a packet network, communications system 100 might not even be able to assume that the relative order of any two or more packets is preserved in transit through channel 145. Therefore, the key of the output symbols is determined using one or more of the keying schemes described above, and not necessarily determined by the order in which the output symbols exit receive module 150.

Receive module 150 provides the output symbols to a decoder 155, and any data receive module 150 receives about the keys of these output symbols is provided to a dynamic key regenerator 160. Dynamic key regenerator 160 regenerates the dynamic keys for the received output symbols and provides these dynamic keys to decoder 155. Static key generator 163 regenerates the static keys $S_0, S_1, \ldots$ and provides them to decoder 155. The static key generator has access to random number generator 135 used both during the encoding and the decoding process. This can be in the form of access to the same physical device if the random numbers are generated on such device, or in the form of access to the same algorithm for the generation of random numbers to achieve identical behavior. Decoder 155 uses the keys provided by dynamic key regenerator 160 and static key generator 163 together with the corresponding output symbols, to recover the input symbols (again IS(0), IS(1), IS(2), ... ). Decoder 155 provides the recovered input symbols to an input file reassembler 165, which generates a copy 170 of input file 101 or input stream 105.

An Encoder

Figure 2:
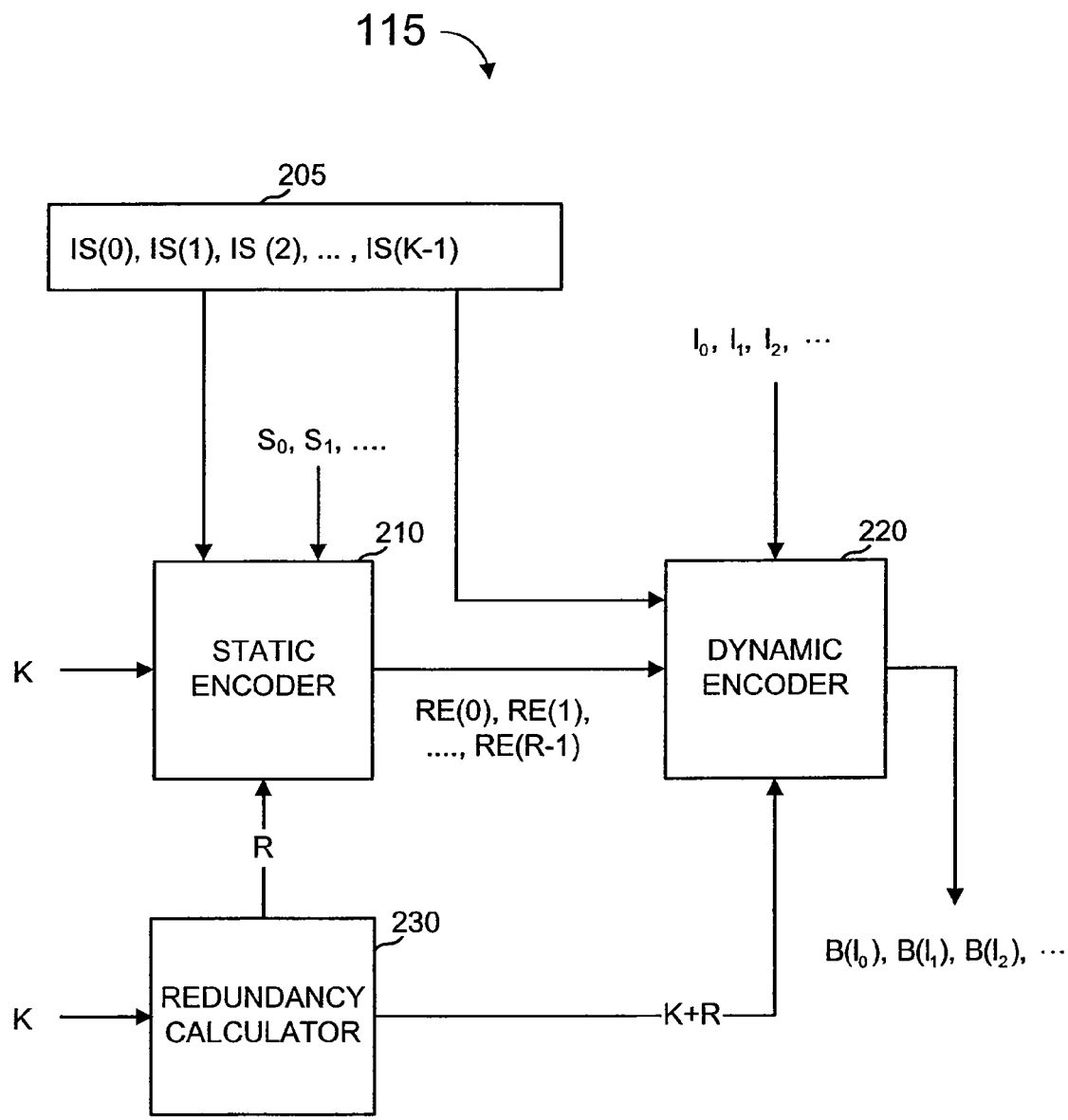
FIG. 2 is a block diagram an encoder according to one embodiment of the present invention.

FIG. 2 is a block diagram of one specific embodiment of encoder 115 shown in FIG. 1. Encoder 115 comprises a static encoder 210, a dynamic encoder 220, and a redundancy calculator 230. Static encoder 210 receives the following inputs: a) original input symbols IS(0), IS(1), ..., IS(K−1) provided by the input symbol generator 110 and stored in an input symbol buffer 205; b) the number K of original input symbols; c) static keys $S_0, S_1, \ldots$ provided by the static key generator 130; and d) a number R of redundant symbols. Upon receiving these inputs static encoder 210 computes R redundant symbols RE(0), RE(1), . . . , RE(R−1) as will be described below. Typically, but not always, the redundant symbols have the same size as the input symbols. In one specific embodiment, the redundant symbols generated by static encoder 210 are stored in input symbol buffer 205. Input symbol buffer 205 may be only logical, i.e., the file may be physically stored in one place and the positions of the input symbols within symbol buffer 205 could only be renamings of the positions of these symbols within the original file.

Dynamic encoder receives the input symbols and the redundant symbols, and generates output symbols as will be described in further detail below. In one embodiment in which the redundant symbols are stored in the input symbol buffer 205, dynamic encoder 220 receives the input symbols and redundant symbols from input symbol buffer 205.

Redundancy calculator 230 computes the number R of redundant symbols from the number K of input symbols. This computation is described in further detail below.

In situations where the speed of generating output symbols is a critical resource, the input file could be encoded using static encoder 210 and stored on an intermediate device before the transmission of output symbols starts. This device could be, for example, an attached storage device at a different physical location than dynamic encoder 220, it could be included in the same physical device as dynamic encoder 220, etc. In the case where the file has been encoded with static encoder 210 well in advance of encoding with dynamic encoder 220, the computational device that implements dynamic encoder 220 need not devote resources to static encoding. Thus, it could devote more resources to dynamic encoding in order to, for example, increase the speed of generating output symbols for the input file, generate output symbols for other files, perform other tasks, etc. Whether or not static encoding can or should be performed in advance of dynamic encoding is dependent upon the particular implementation.

Overview of Static Encoder

Figure 3:
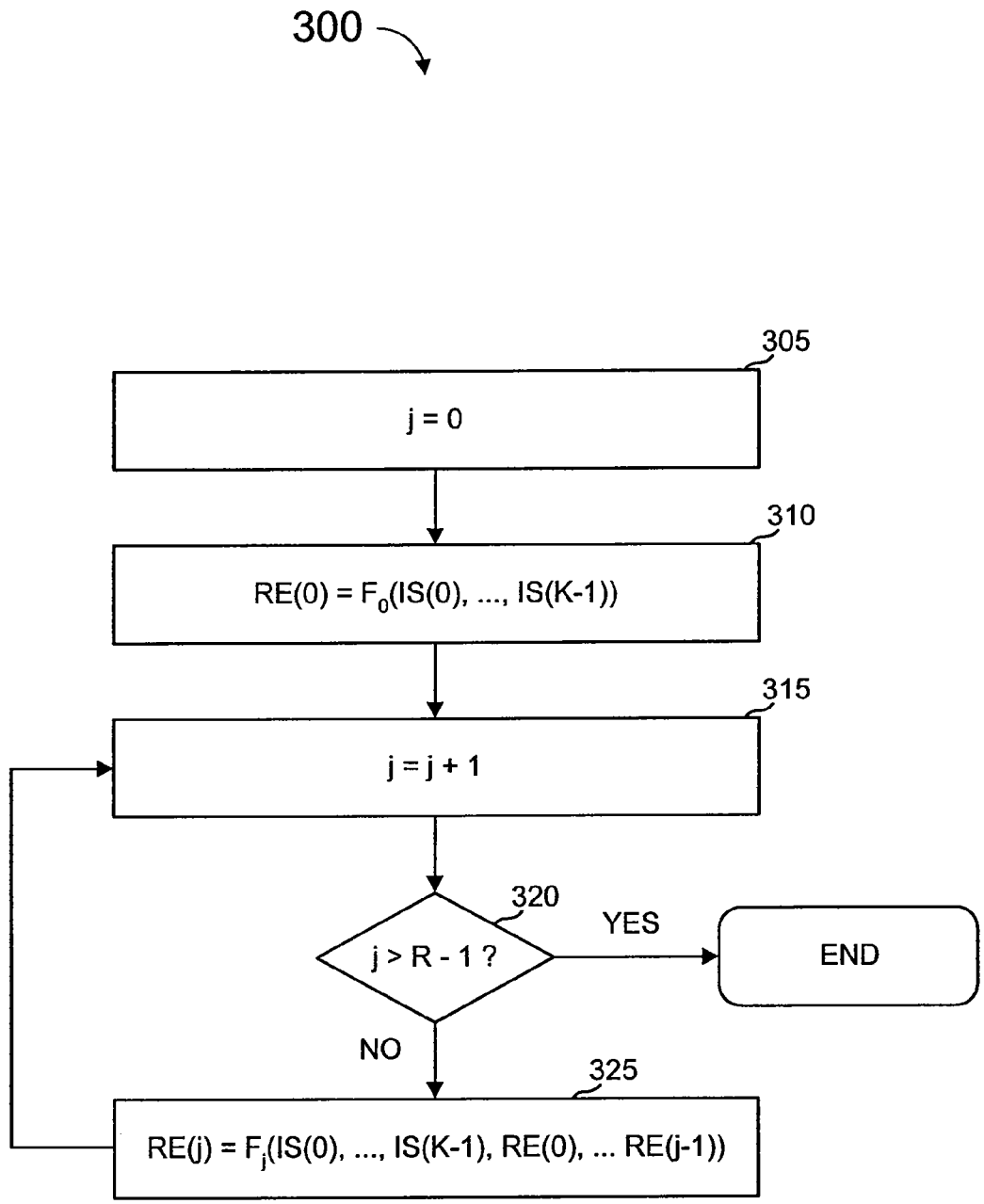
FIG. 3 is a simplified block diagram of a method of generating redundant symbols according to one embodiment of the present invention.
Figure 4:
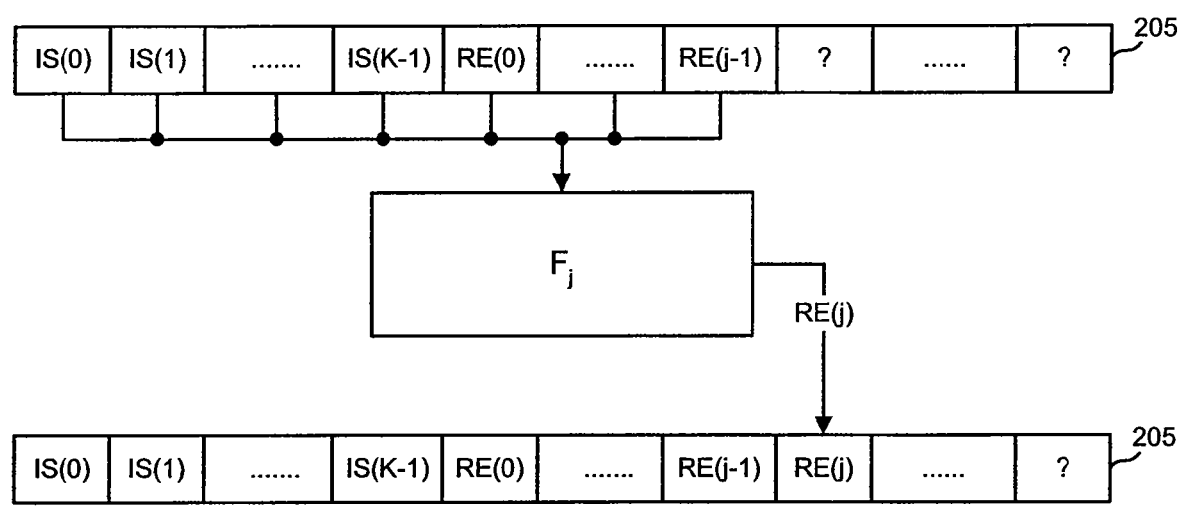
FIG. 4 is a simplified block diagram of the basic operation of a static encoder according to one embodiment of the present invention.

The general operation of static encoder 210 will be described with reference to FIGS. 3 and 4. FIG. 3 is a simplified flow diagram illustrating one embodiment of a method of statically encoding. In a step 305, a variable j, which keeps track of how many redundant symbols have been generated, is set to zero. Then, in a step 310, a first redundant symbol RE(0) is computed as a function $F_0$ of at least some of the input symbols IS(0), . . . , IS(K−1). Then, in a step 315, the variable j is incremented. Next, in a step 320, it is tested whether all of the redundant symbols have been generated (i.e., is j greater than R−1?). If yes, then the flow ends. Otherwise, the flow proceeds to step 325. In step 325, RE(j) is computed as a function $F_j$ of the input symbols IS(0), . . . , IS(K−1) and of the previously generated redundant symbols RE(0), . . . , RE(j−1), where $F_j$ need not be a function that depends on every one of the input symbols or every one of the redundant symbols. Steps 315, 320, and 325 are repeated until R redundant symbols have been computed.

Referring again to FIGS. 1 and 2, in some embodiments, static encoder 210 receives one or more static keys $S_0, S_1, \ldots$ from static key generator 130. In these embodiments, the static encoder 210 uses the static keys to determine some or all of functions $F_0, F_1, \ldots F_{j-1}$. For example, static key $S_0$ can be used to determine function $F_0$, static key $S_1$ can be used to determine function $F_1$, etc. Or, one or more of static keys $S_0, S_1, \ldots$ can be used to determine function $F_0$, one or more of static keys $S_0, S_1, \ldots$ can be used to determine function $F_1$, etc. In other embodiments, no static keys are needed, and thus static key generator 130 is not needed.

Referring now to FIGS. 2 and 3, in some embodiments, the redundant symbols generated by static encoder 210 can be stored in input symbol buffer 205. FIG. 4 is a simplified illustration of the operation of one embodiment of static encoder 210. Particularly, static encoder 210 generates redundant symbol RE(j) as a function Fj of input symbols IS(0), . . . , IS(K−1), RE(0), . . . , RE(j−1), received from input symbol buffer 205, and stores it back into input symbol buffer 205. The exact form of the functions $F_0, F_1, \ldots, F_{R-1}$ depends on the particular application. Typically, but not always, functions $F_0, F_1, \ldots, F_{R-1}$ include an exclusive OR of some or all of their corresponding arguments. As described above, these functions may or may not actually employ static keys generated by static key generator 130 of FIG. 1. For example, in one specific embodiment described below, the first few functions implement a Hamming code and do not make any use of the static keys $S_0, S_1, \ldots$, whereas the remaining functions implement a Low-Density Parity-Check code and make explicit use of the static keys.

Overview of Dynamic Encoder

Referring again to FIG. 2, dynamic encoder 220 receives input symbols IS(0), . . . , IS(K−1) and the redundant symbols RE(0), . . . , RE(R−1) and a key I for each output symbol it is to generate. The collection comprising the original input symbols and the redundant symbols will be referred to as the collection of "dynamic input symbols" hereafter.

Figure 5:
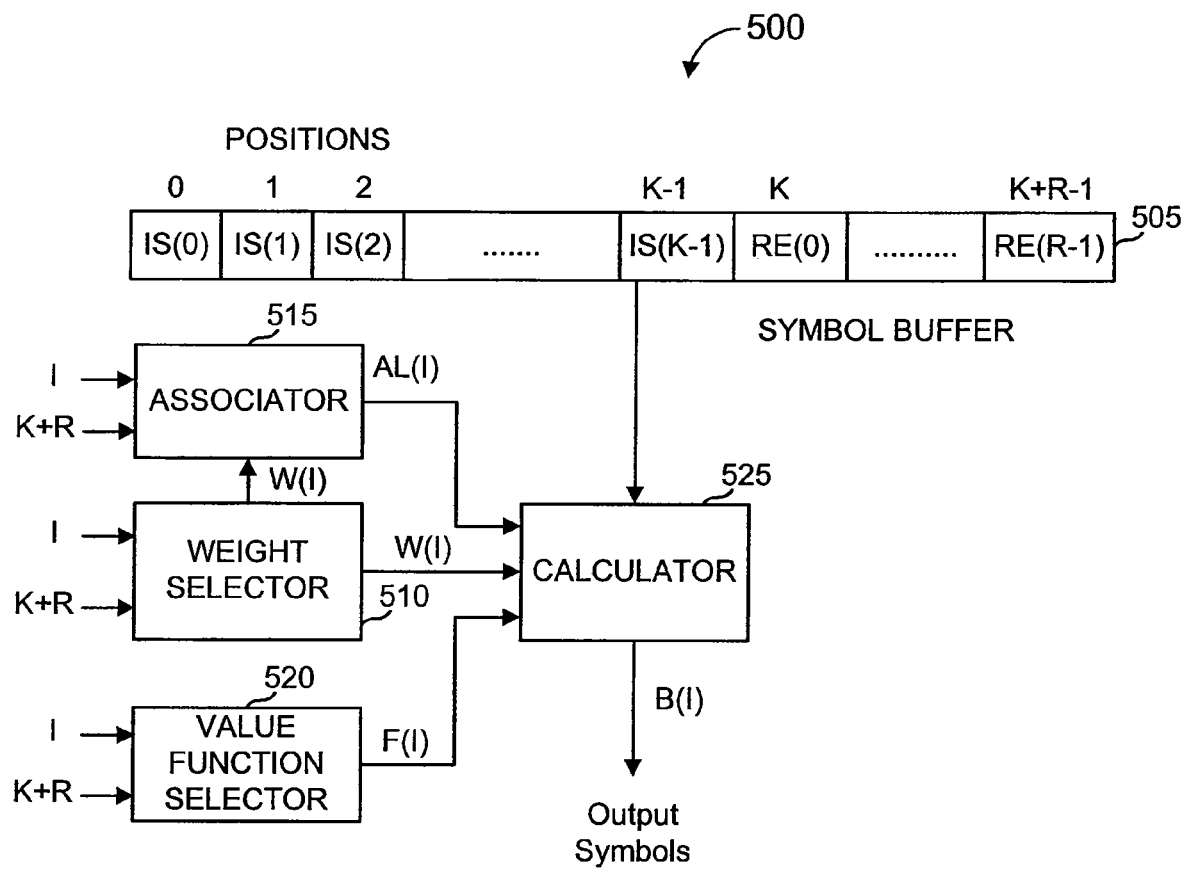
FIG. 5 is a simplified block diagram of a dynamic encoder according to one embodiment of the present invention.

FIG. 5 is a simplified block diagram of one embodiment of a dynamic encoder. This encoder is similar to embodiments of encoders described in Luby I. Luby I describes further details on the operation of such an encoder.

Dynamic encoder 500 includes a weight selector 510, an associator 515, a value function selector 520 and a calculator 525. As shown in FIG. 5, the K+R dynamic input symbols are stored in a dynamic symbol buffer 505. In one embodiment, dynamic symbol buffer 505 is input symbol buffer 205 of FIG. 2. In other embodiments, dynamic symbol buffer 505 is separate from input symbol buffer 205. Dynamic key I (provided by the dynamic key generator 120 shown in FIG. 1) is an input to weight selector 510, associator 515 and value function selector 520. The number of dynamic input symbols K+R is also provided to these three components, 510, 515 and 520. Calculator 525 is coupled to receive outputs from weight selector 510, associator 515 and value function selector 520, and to receive symbols from dynamic symbol buffer 505. Calculator 525 generates output symbol values. It should be understood that other equivalent arrangements to the elements shown in FIG. 5 might be used, and that this is but one example of an encoder according to the present invention. For instance, Luby I and Luby II describe other encoders that can be used in other embodiments according to the present invention.

In operation, the K+R dynamic input symbols are received from input symbol buffer 205 and stored in dynamic input symbol buffer 505. As explained above, each dynamic input symbol has a position (for example, the position of an input symbol may be its original position in the input file) and a value. The dynamic input symbols need not be stored in dynamic input symbol buffer 505 in their respective order, so long as the position of stored dynamic input symbols can be determined.

Using key I and the number of dynamic input symbols K+R, weight selector 510 determines the number W(I) of dynamic input symbols that are to be "associates" of the output symbol having key I. Using key I, weight W(I), and the number of dynamic input symbols K+R, associator 515 determines a list AL(I) of positions of dynamic input symbols associated with the output symbol. It should be understood that W(I) need not be separately or explicitly calculated if associator 515 can generate AL(I) without knowing W(I) ahead of time. Once AL(I) is generated, W(I) can be easily determined because it is the number of associates in AL(I).

Associator 515 is a mapping that receives as input a key I, a number N, and a number t and produces a list X(0), . . . , X(t−1) of integers between 0 and N−1. Preferably, these integers are distinct and uniformly distributed on their range. For example, in the case of dynamic encoder 500 in FIG. 5, N is equal to K+R, t is equal to W(I), and AL(I) is the list X(0), . . . , X(t−1).

The mapping given by associator 515 can take a variety of forms. It can have access to a source of truly random or pseudorandom bits to make its output random. However, it should be chosen to produce the same output by both encoder and decoder for the same key I, the same N, and the same t. To satisfy this requirement, a pseudorandom sequence could be generated by both encoder and decoder seeded with the key I. Instead of a pseudorandom sequence, a truly random sequence might be used for the computing the output, but for that to be useful, the random sequence used for generating the output would need to be communicated to the decoder.

Referring again to FIG. 5, once I, W(I) and AL(I) are known, the value B(I) of the output symbol is calculated by calculator 525 based on a value function F(I). One property of a suitable value function is that it would allow the value for an associate indicated by AL(I) to be determined from output symbol value B(I) and from the values for the other W(I)−1 associates indicated by AL(I). One preferred value function used in this step is the XOR value function, since it satisfies this property, is easily computed and easily inverted. However, other suitable value functions might be used instead. For example, Luby II describes other suitable value functions that can be used.

If used, value function selector 520 determines a value function F(I) from key I and from K+R. In one variation, the value function F(I) is the same value function F for all I. In that variation, value function selector 520 is not needed and calculator 525 can be configured with the value function F. For example, the value function might be XOR for all I, i.e., the output symbol value is an XOR (exclusive OR) of the values of all of its associates.

For each key I, weight selector 510 determines a weight W(I) from 1 and K+R. In one variation, weight selector 510 selects W(I) by using the key I to first generate a random looking number and then uses this number to look up the value of W(I) in a distribution table that is stored within, or accessible by, weight selector 510. A more detailed description of how such a distribution table might be formed and accessed is described below. Once weight selector 510 determines W(I), this value is provided to associator 515 and to calculator 525.

Using list AL(I), weight W(I) and either the value function F(I) provided by value function selector 520 or a preselected value function F, calculator 525 accesses the W(I) dynamic input symbols referenced by AL(I) in dynamic input symbol buffer 505 to calculate the value, B(I), for the current output symbol. An example of a procedure for calculating AL(I) is described below, but another suitable procedure might be used instead. Preferably, the procedure gives each input symbol a roughly even chance of being selected as an associate for a given output symbol and does the selection in a way that the decoder can replicate if the decoder does not already have AL(I) available to it.

Dynamic encoder 500 then outputs B(I). In effect, dynamic encoder 500 performs the action illustrated in FIG. 6, namely, to generate an output symbol value B(I) as some value function of selected input symbols. In the example shown, the value function is XOR, the weight W(I) of the output symbol is 3, and the associated dynamic input symbols (the associates) are at positions 0, 2, and K+R−2 and have respective values IS(0), IS(2) and RE(R−2). Thus, the output symbol is calculated as:

$$B(I) = IS(0) \oplus IS(2) \oplus RE(R-2)$$

for that value of I. In case the value function XOR is used, it is understood that the redundant symbols have the same number of bits as the original symbols IS(0), . . . , IS(K−1) and these in turn have the same number of bits as the output symbols.

The generated output symbols are then transmitted and received as described above. Herein, it is assumed that some of the output symbols might have been lost or gotten out of order, or were generated by one or more encoders. It is assumed, however, that the output symbols that are received have been received with an indication of their key and some assurance their values B(I) are accurate. As shown in FIG. 1, those received output symbols, together with their corresponding keys reconstructed from their indication by dynamic key regenerator 160, the values K and R, and the static keys $S_0, S_1, \ldots$ regenerated by static key generator 163, are the input to decoder 155.

Static Encoder

The main function of the static encoder is to add redundant information to the original data in such a way that recovery of the original data is possible in face of erasures. Such redundant information can assist a decoder to recover the input symbols that a dynamic decoder could not recover. In typical applications, the static encoder should be efficient in terms of the number of redundant symbols required to guarantee recovery to a desired degree of accuracy in the face of erasures, and/or in terms of the computational expense of the encoding process and/or the decoding process. For instance, for a given target erasure rate p which is, in applications, dictated by the performance of the dynamic decoder, the aim is to make the number R of redundant symbols as small as possible while guaranteeing fast recovery of the original data if at most a fraction p of the data is lost. A class of codes satisfying these requirements is that of LDPC codes, well-known to those skilled in the art. While these codes can recover the original data in many cases, there are infrequent occasions in which they recover everything but two or three of the original input symbols. Thus, in some embodiments, prior to LDPC encoding, the input data is first encoded using a code that can recover the original data if there are two or three erasures. This first encoding generates a first plurality of redundant symbols. After this first encoding, the plurality of the original symbols and the first plurality of redundant symbols are encoded using an LDPC encoder. The extended Hamming code, which is well-known to those skilled in the art and which is described briefly below, is suitable for the purpose of the first level of encoding, as it can recover the original data if there are three or less erasures, and does so by adding a small number of redundant symbols. It is to be understood that other types of encoding can also be used. For instance, in some applications, it may be acceptable that all but two or three of the input symbols are recovered. Thus, in such applications, an LDPC code alone may be appropriate. Additionally, other types of encoding might be appropriate for a particular application such as Reed-Solomon, Tornado, etc. Therefore, it is to be understood that many types of encodings alone or in combination can be used according other embodiments of the present invention.

Figure 7:
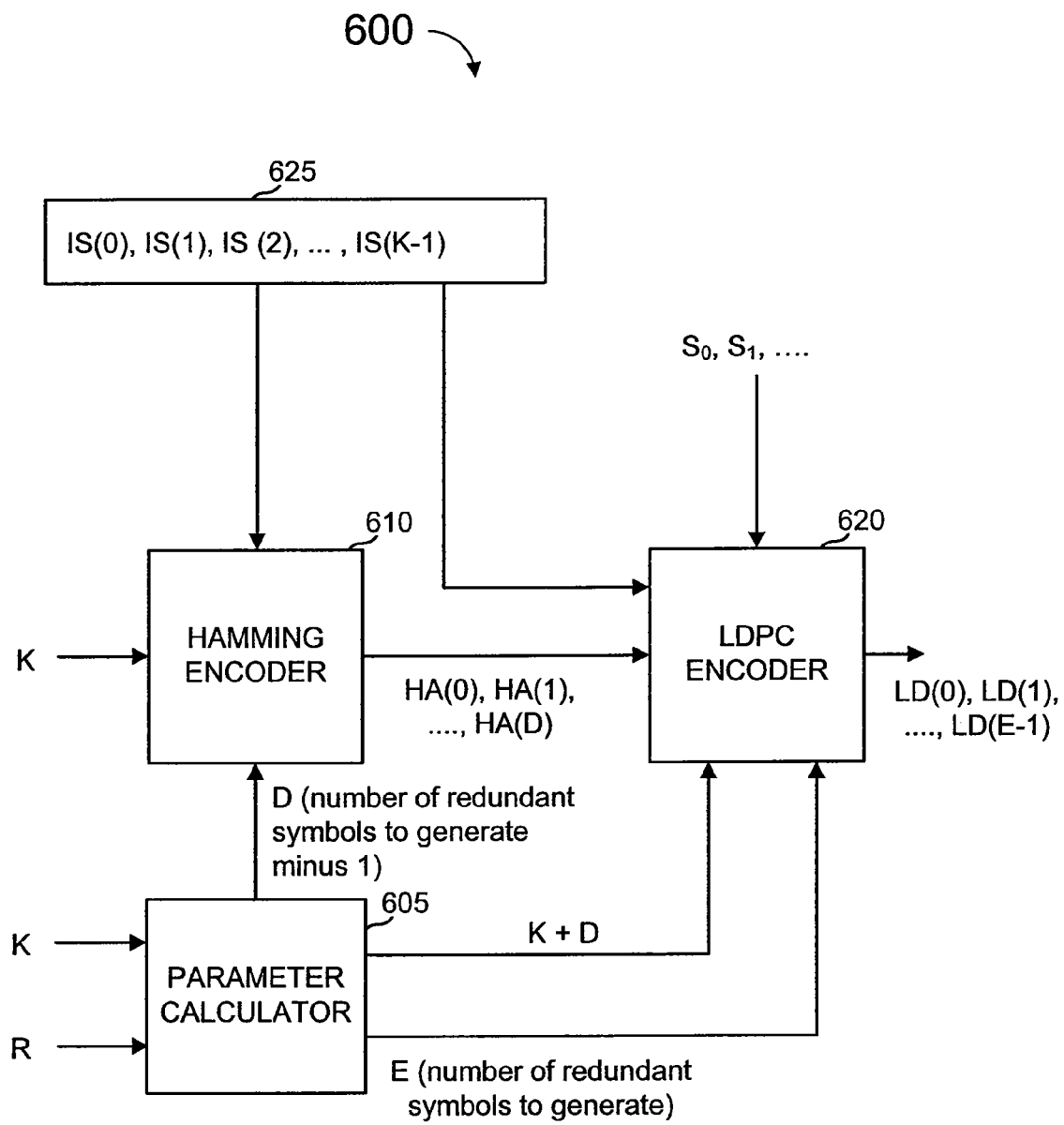
FIG. 7 is a simplified block diagram of a static encoder according to one embodiment of the present invention.

FIG. 7 is a simplified block diagram of one specific embodiment of a static encoder according to the present invention. Static encoder 600 comprises a parameter calculator 605, a Hamming encoder 610, and a low-density-parity-check (LDPC) encoder 620. Parameter calculator 605 receives the number K of input symbols and the number R of redundant symbols to be generated, and generates parameters D and E. D is an indication of the number of redundant symbols to be generated by Hamming encoder 610, and E is an indication of the number of redundant symbols to be generated by LDPC encoder 620. Parameter D is provided to Hamming encoder 610 and parameter E is provided to LDPC encoder 620.

Hamming encoder 610 is coupled to receive the input symbols IS(0), . . . , IS(K−1) from an input symbol buffer 625, the number K of input symbols, and the parameter D. In response, Hamming encoder 610 generates D+1 redundant symbols HA(0), HA(1), . . . , HA(D) according to a Hamming code. In one embodiment, input symbol buffer 625 is input symbol buffer 205 of FIG. 2. The Hamming encoding process adds D+1 redundant symbols to the original K input symbols, wherein D is the smallest number such that $2^D-D-1 \geq K$. As is known to those skilled in the art, the redundant symbols are chosen in such a way that for any possible setting of the input symbols such that not all of them are zeros, at least four of the symbols among the plurality of the input symbols and the corresponding redundant symbols are nonzero. This property guarantees correction of at least three erasures. Hamming encoder 610 can be implemented in any number of ways known to those skilled in the art of error-correcting and erasure-correcting codes.

LDPC encoder 620 is coupled to receive the input symbols IS(0), . . . , IS(K−1), the number K+D+1 of input symbols and Hamming encoded redundant symbols, the parameter E, and static keys $S_0, S_1, \ldots$. In response, LDPC encoder 620 generates E redundant symbols according to a LDPC code. The number E of redundant symbols calculated by the LDPC encoder is equal to R−D−1, wherein R is the number of redundant symbols. As is known to those skilled in the art, there are various ways of encoding information using LDPC codes. LDPC codes are described by means of a graph structure comprising a set of message nodes, a set of check nodes and edges connecting message nodes to check nodes. The set of valid LDPC codewords is the set of those settings of the message nodes such that for each check node, the XOR of the neighboring message nodes is zero. In certain applications, it is preferable for the message nodes to all have the same degree, i.e., to be connected to the same number of check nodes, as this simplifies the implementation of the encoder, and also makes the calculation of the error probability of the decoder easier. In one specific embodiment of the invention, the number of check nodes to which each message node is connected is four. It has been found that this number provides an acceptable trade-off between the running time/computational load of the encoder and the probability of failure of the decoder. Moreover, it has also been found that it is preferable for the check nodes neighboring a given message node to be randomly chosen among the set of check nodes. LDPC encoder 620 can be implemented in any number of ways known to those skilled in the art of error-correcting and erasure-correcting codes.

Figure 8:
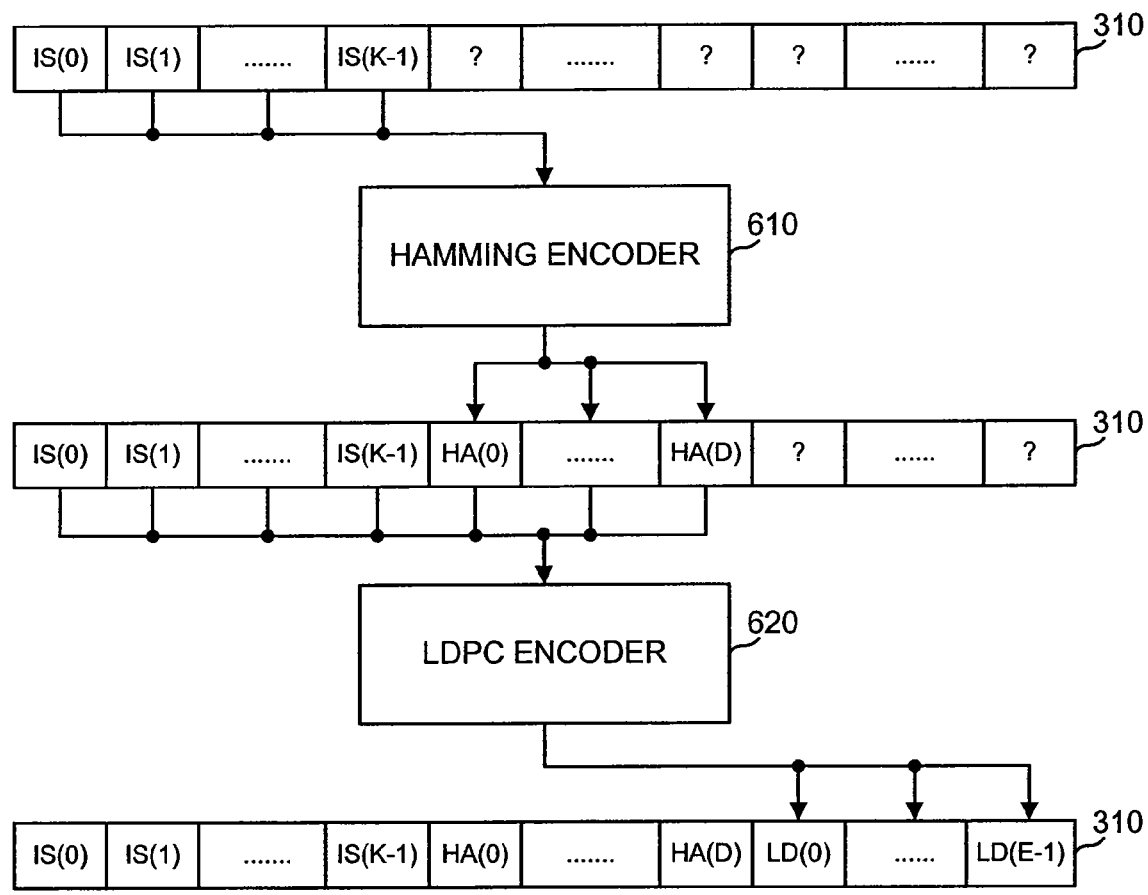
FIG. 8 is a simplified block diagram of the basic operation a static encoder according to one embodiment of the present invention.

FIG. 8 illustrates the operation of one embodiment of the present invention that employs the static encoder shown in FIG. 7. Particularly, Hamming encoder 610 receives the input symbols from input symbol buffer 205 (FIG. 2), and generates D+1 Hamming encoded redundant symbols, which are stored in input symbol buffer 205. Then, LDPC encoder 620 receives the input symbols and the D+1 Hamming encoded redundant symbols from input symbol buffer 205, and generates E LDPC encoded redundant symbols, which are stored in input symbol buffer 205.

As described above, in some embodiments, LDPC encoder 620 receives static keys $S_0, S_1, \ldots$ generated by static key generator 130 of FIG. 1. In one embodiment, static key generator 130 is a random number generator that generates a sequence of random-looking numbers (static keys $S_0, S_1, \ldots$) upon receipt of a seed. The seed can take a variety of forms. For example, it could be the value of a truly random number generator. As another example, the seed could be a string obtained in a deterministic way from a CPU clock. Whatever the seed is, it should be communicated to the decoder so that the same sequence of static keys can be generated by the decoder. It many applications, it will be advantageous to have a seed which is not too large. In many applications the seed could be a 32 bit integer, or a 64 bit integer.

Figure 6:
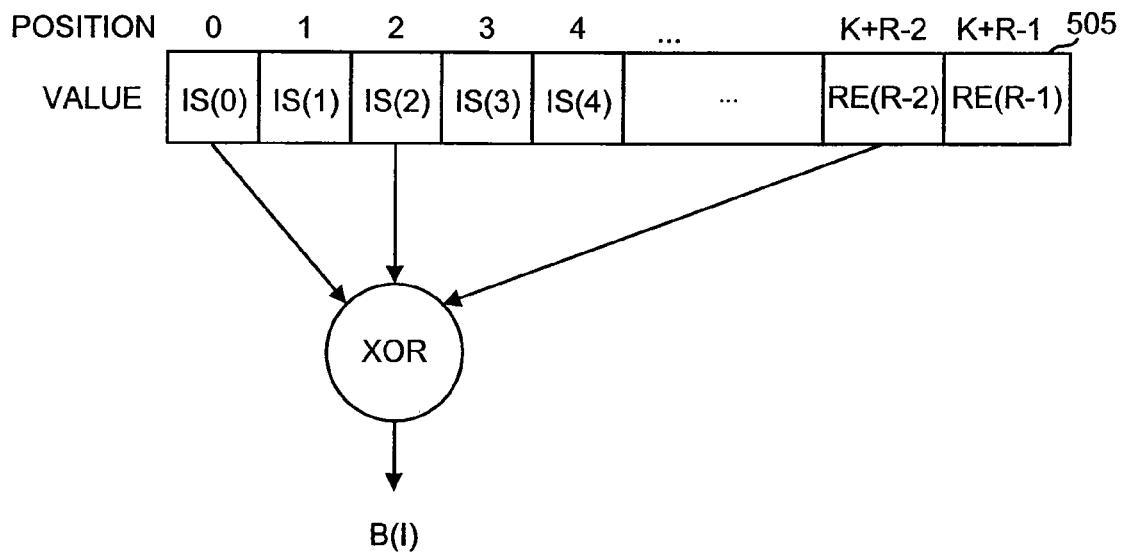
FIG. 6 is a simplified block diagram of a basic operation of a dynamic encoder according to one embodiment of the present invention.
Figure 9:
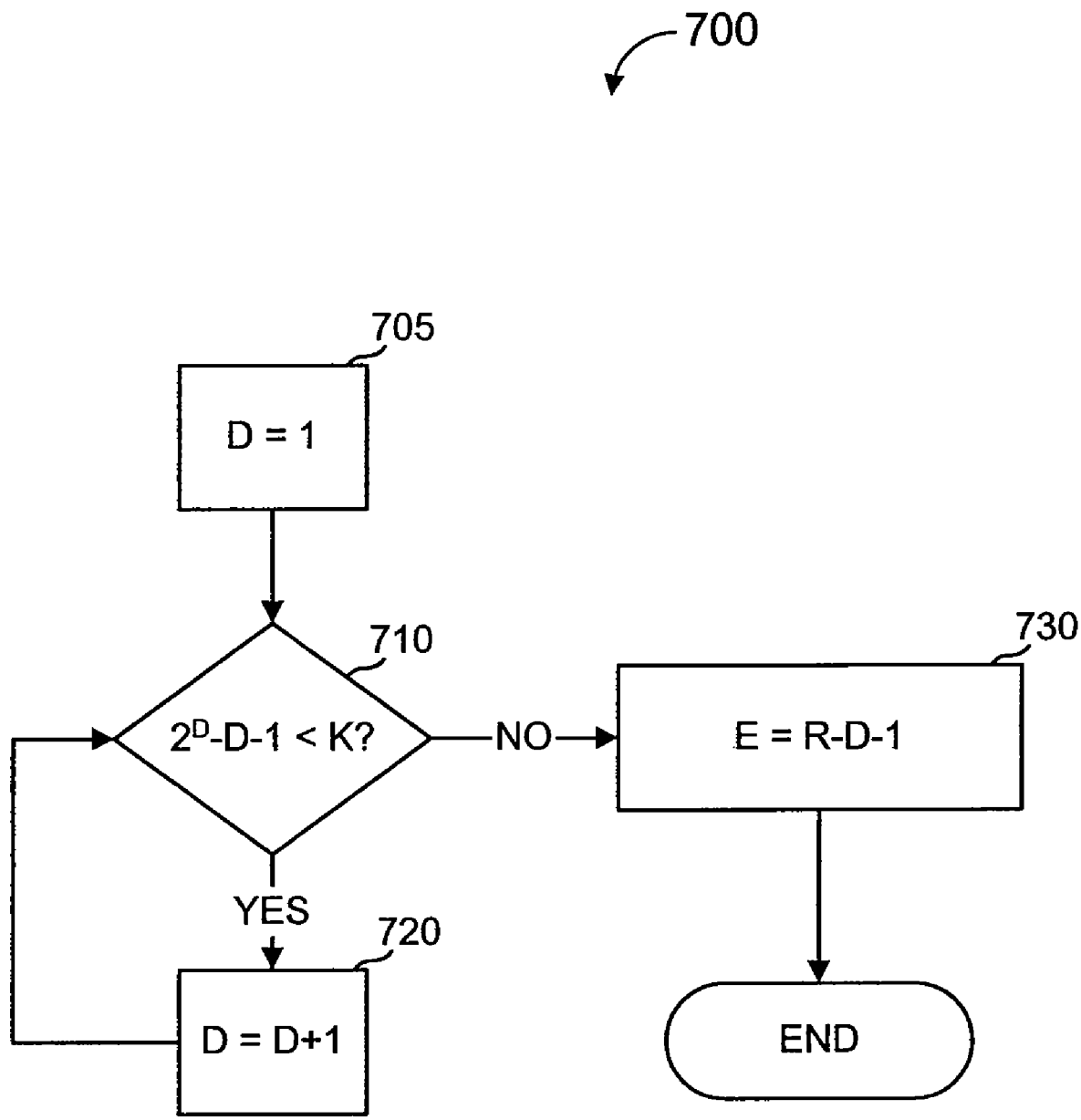
FIG. 9 is a simplified diagram of a method for calculating encoding parameters according to one specific embodiment of a static encoder.

In one specific embodiment of static encoder 600 illustrated in FIG. 6, the parameter D is calculated as the largest integer D such that $2^D-D-1$ is greater than or equal to the number K of input symbols. Additionally, the parameter E is calculated as R−D−1. FIG. 9 is a simplified flow diagram illustrating one embodiment of a parameter calculator, such as parameter calculator 605 of FIG. 7, that calculates parameter D and E as described above. First, in a step 705, parameter D is initialized to one. Then, in step 710, it is determined whether $2^D-D-1$ is less than K. If no, then the flow proceeds to step 730. If yes, the flow proceeds to step 720, where the parameter D is incremented. Then, the flow proceeds back to step 710. Once D has been determined, then, in step 730, the parameter E is calculated as R−D−1.

Referring again to FIG. 1, in some particular applications, the file or stream to be transmitted over channel 145 is rather small. For example, the input file could be a short audio message or the content of a web-page comprising some tens of kilobytes. The particular embodiments of a static encoder described above may be less than optimal in such scenarios. For instance, some of the above-described embodiments may lead to inefficient use of memory and processor speed, and hence slower reconstruction of the data. Also, some of the above-described embodiments may require a larger reception overhead to reconstruct the data within reliability parameters set by the user of the system. Additionally, some of the above-described embodiments may lead reconstruction of the data that is less reliable than desired.

Figure 10:
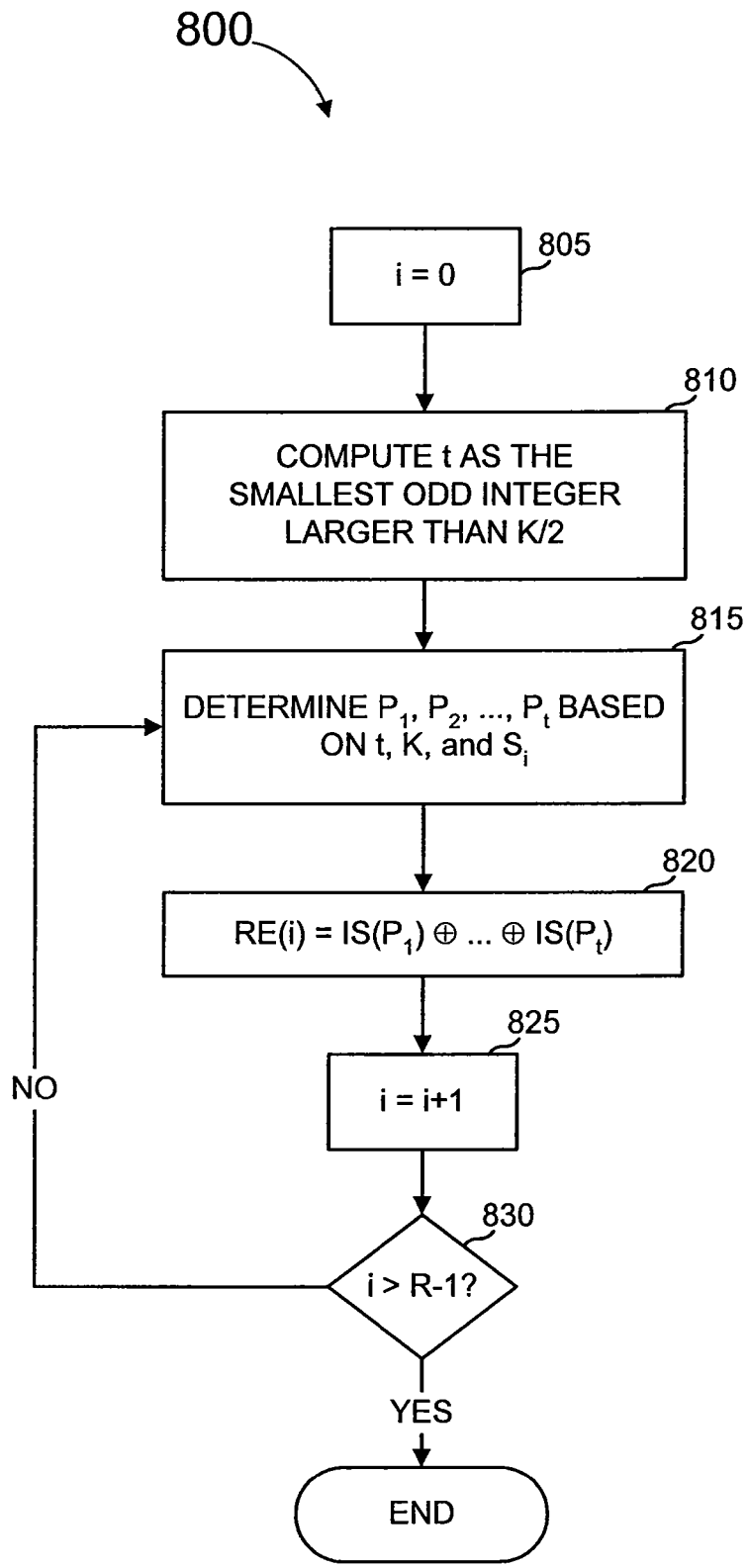
FIG. 10 is a simplified flow diagram of a static encoder according to another embodiment of the present invention.

It has been found that the failure probability of the decoder increases when the number of input symbols is decreased. It has also been found that this is largely because the encoding process does not create enough information about the original content if the size of the original content is relatively small. Therefore, another embodiment of an encoder might be used that generates redundant symbols that convey more information about the original symbols. FIG. 10 is a simplified flow diagram of such an encoder according to one embodiment of the present invention, which will now be described.

First, in step 805, a variable i is initialized to zero. Variable i keeps track of the number of redundant symbols already generated. In step 810, a number t is calculated as the smallest odd integer greater than or equal to K/2. In step 815, values $P_1, P_2, \ldots, P_t$ are generated based on K, t, and a static key $S_i$. The values $P_1, P_2, \ldots, P_t$ indicate the positions of input symbols that will be used to generate a redundant symbol. In one particular embodiment, an associator such as associator 515 of FIG. 5 is used to generate $P_1, P_2, \ldots, P_t$. In particular, the value t can be provided as the W(I) input, the value K can be provided as the K+R input, and the static key $S_i$ can be provided as the key I input. It should be noted that many different values of t would yield similar coding effects, and thus this particular choice is only an example.

In step 820, the value of RE(i) is computed as the XOR of the values $IS(P_1), IS(P_2), \ldots, IS(P_t)$. In step 825, the variable i is incremented by one to prepare computation of the next redundant symbol, and in step 830, it is determined whether all the redundant symbols have been computed. If not, then the flow returns to step 815.

Decoder Overview

Figure 11:
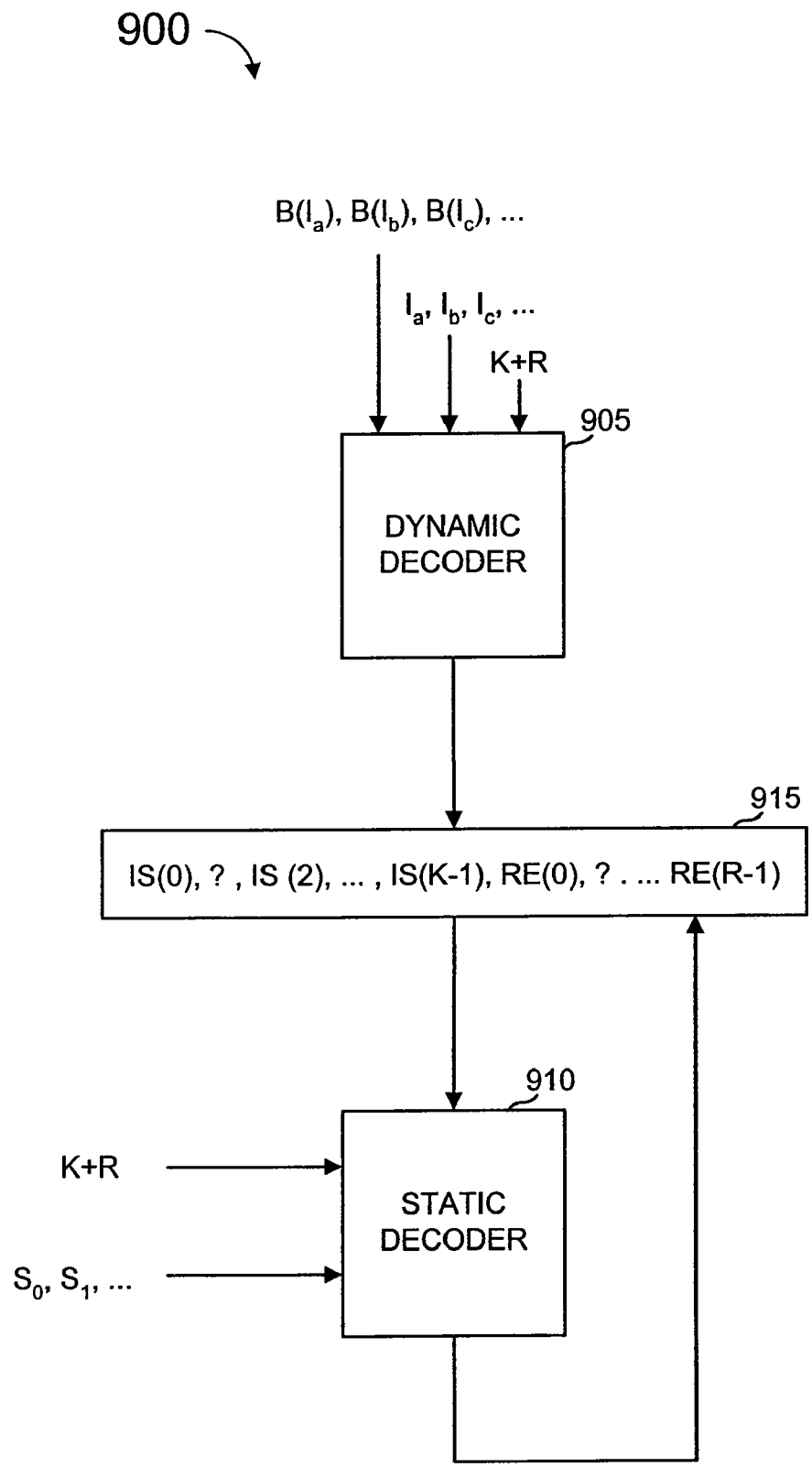
FIG. 11 is a simplified block diagram of a decoder according to one embodiment of the present invention.

FIG. 11 is a simplified block diagram illustrating one embodiment of a decoder according to the present invention. Decoder 900 can be used, for example, to implement decoder 155 of FIG. 1.

Decoder 900 comprises a dynamic decoder 905 and a static decoder 910. Dynamic decoder 905 receives the output symbols $B(I_a), B(I_b), \ldots$ from receive module 150 in FIG. 1, and dynamic keys $I_a, I_b, I_c, \ldots$ from dynamic key regenerator 160. Upon reception of these data, dynamic decoder 905 attempts to reconstruct the input symbols $IS(0), \ldots, IS(K-1)$ and the redundant symbols $RE(0), \ldots, RE(R-1)$. One advantage of some embodiments of the present invention is that dynamic decoder 905 need not finish the decoding all of the input symbols. Rather, static decoder 910 can be used to decode input symbols that dynamic decoder 905 did not recover.

Input symbols and redundant symbols recovered by dynamic decoder 905 are stored in a reconstruction buffer 915. Upon completion of dynamic decoding, static decoder 910 attempts to recover any input symbols not recovered by dynamic decoder 905, if any. In particular, static decoder 910 receives input symbols and redundant symbols from reconstruction buffer 915. Additionally, static decoder 910 receives static keys $S_0, S_1, \ldots$, if used, from static key generator 130 (FIG. 1). Referring again to FIG. 1, in one specific embodiment, the static keys can be regenerated by communicating a common seed through communication channel 145 to random number generator 135 which drives static key generator 130. The recovered input symbols are provided to input file reassembler 165.

Figure 12:
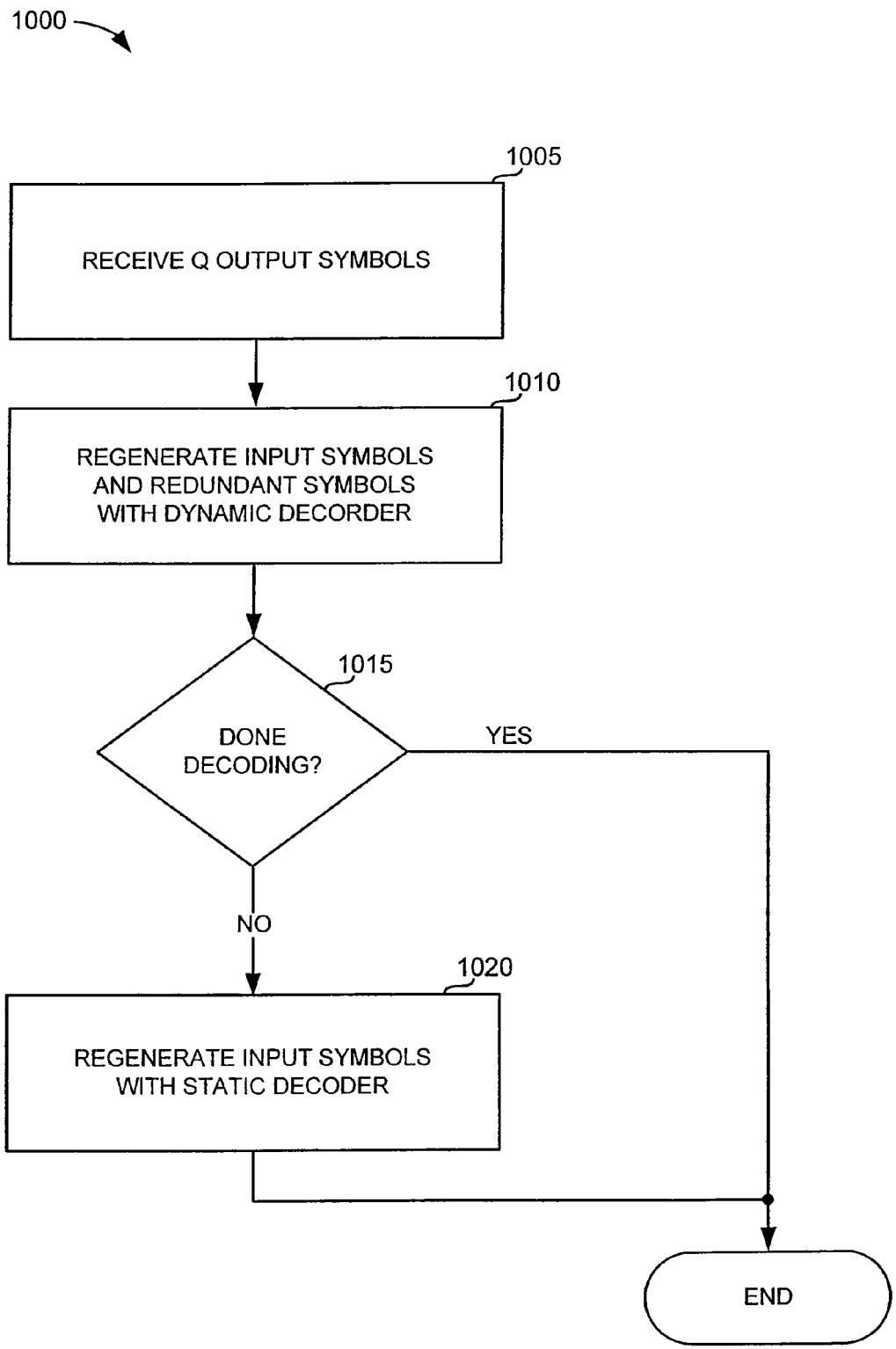
FIG. 12 is a simplified flow diagram of an operation of a decoder according to one embodiment of the present invention.

FIG. 12 is a simplified flow diagram illustrating one embodiment of a method for decoding according to the present invention. In step 1005, Q output symbols are received by the decoder. The value of Q can depend on the number of input symbols and the specific dynamic encoder used. The value of Q can also depend on the desired degree of accuracy to which the decoder can recover the input symbols. For example, if it is desired that the decoder can recover all of the input symbols with a high probability, then Q should be chosen to be larger than the number of input symbols. Particularly, in some applications, when the number of input symbols is large, Q can be less than 3% larger than the number of original input symbols. In other applications, when the number of input symbols is small, Q can be at least 10% larger than the number of input symbols. Specifically, Q can be chosen as the number K of input symbols plus a number A, where A is chosen to ensure that the decoder can regenerate all of the input symbols with a high probability. Determination of the number A is described in more detail below. If it is acceptable for the decoder to be unable to decode all of the input symbols (either sometimes or always), then Q can be less than K+A, equal to K, or even less than K. Clearly, one aim of an overall coding system will often be to decrease the number Q as much as possible, while maintaining good probabilistic guarantees on the success of the decoding process with respect to the desired degree of accuracy.

In step 1010, dynamic decoder 905 regenerates input symbols and redundant symbols from the Q received output symbols. It is to be understood, that steps 1005 and 1010 can be performed substantially concurrently. For example, dynamic decoder 905 can begin regenerating input symbols and redundant symbols prior to the decoder receiving Q output symbols.

After dynamic decoder 905 has processed Q output symbols, then it is determined whether the input symbols have been recovered to a desired degree of accuracy. The desired degree of accuracy may be, for example, all of the input symbols, or some number, percentage, etc., less than all of the input symbols. If yes, then the flow ends. If no, then the flow proceeds to step 1020. In step 1020, static decoder 910 attempts to recover any input symbols that dynamic decoder 905 was unable to recover. After static encoder 910 has processed the input symbols and redundant symbols recovered by dynamic encoder 905, then the flow ends.

Figure 13:
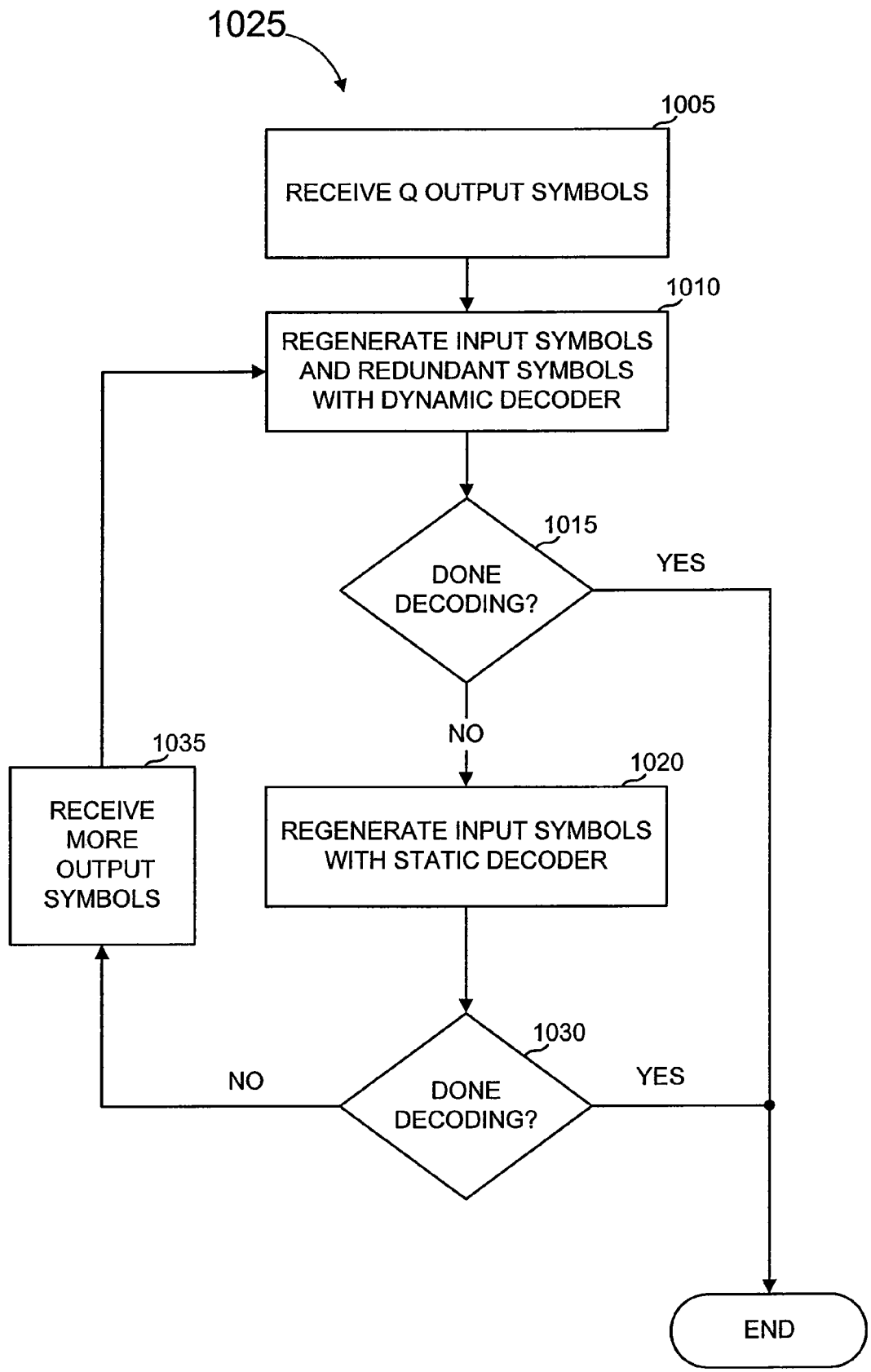
FIG. 13 is a simplified flow diagram of an operation of a decoder according to another embodiment of the present invention.

FIG. 13 is a simplified flow diagram illustrating another embodiment of a method for decoding according to the present invention. This embodiment is similar to that described with respect to FIG. 12, and includes steps 1005, 1010, 1015, and 1020 in common. But, after step 1020, the flow proceeds to step 1030, in which it is determined whether the input symbols have been recovered to a desired degree of accuracy. If yes, then the flow ends. If no, then the flow proceeds to step 1035. In step 1035, one or more additional output symbols are received. Then, the flow proceeds back to step 1010, so that dynamic decoder 905 and/or static decoder 910 can attempt to recover the remaining unrecovered input symbols.

Figure 14:
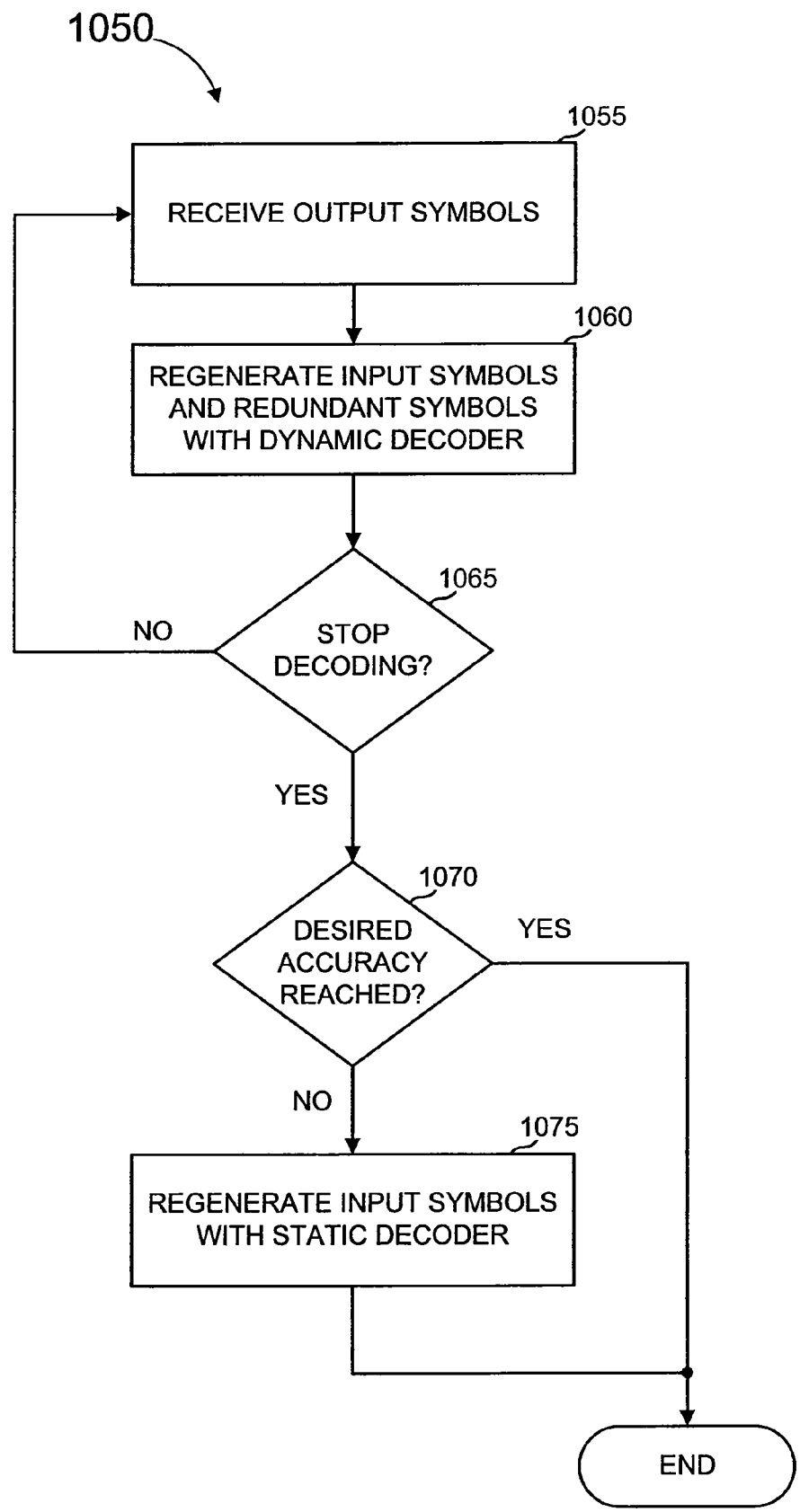
FIG. 14 is a simplified flow diagram of an operation of a decoder according to yet another embodiment of the present invention.

FIG. 14 is a simplified flow diagram illustrating yet another embodiment of a method for decoding according to the present invention. In step 1055, output symbols are received by the decoder, and in step 1060, dynamic decoder 905 regenerates input symbols and redundant symbols from the received output symbols. Then, in step 1065, it is determined whether dynamic decoding should be ended. This determination can be based on one or more of the number of output symbols processed, the number of input symbols recovered, the current rate at which additional input symbols are being recovered, the time spent processing output symbols, etc.

It is to be understood that steps 1055, 1060 and 1065 can be performed substantially concurrently. For example, dynamic decoder 905 can begin regenerating input symbols and redundant symbols as the decoder continues to receive output symbols. Additionally, an evaluation of whether to stop the dynamic decoding process can be performed periodically while output symbols are being received and/or while output symbols are being processed by dynamic decoder 905.

In step 1065, if it is determined that dynamic decoding is not to be stopped, then the flow proceeds back to step 1055. But, if in step 1065, it is determined to end dynamic decoding, then the flow proceeds to step 1070. In step 1070, it is determined whether the input symbols have been recovered to a desired degree of accuracy. If yes, then the flow ends. If no, then the flow proceeds to step 1075. In step 1075, static decoder 910 attempts to recover any input symbols that dynamic decoder 905 was unable to recover. After static encoder 910 has processed the input symbols and redundant symbols recovered by dynamic encoder 905, the flow ends.

Dynamic Decoder

Figure 15:
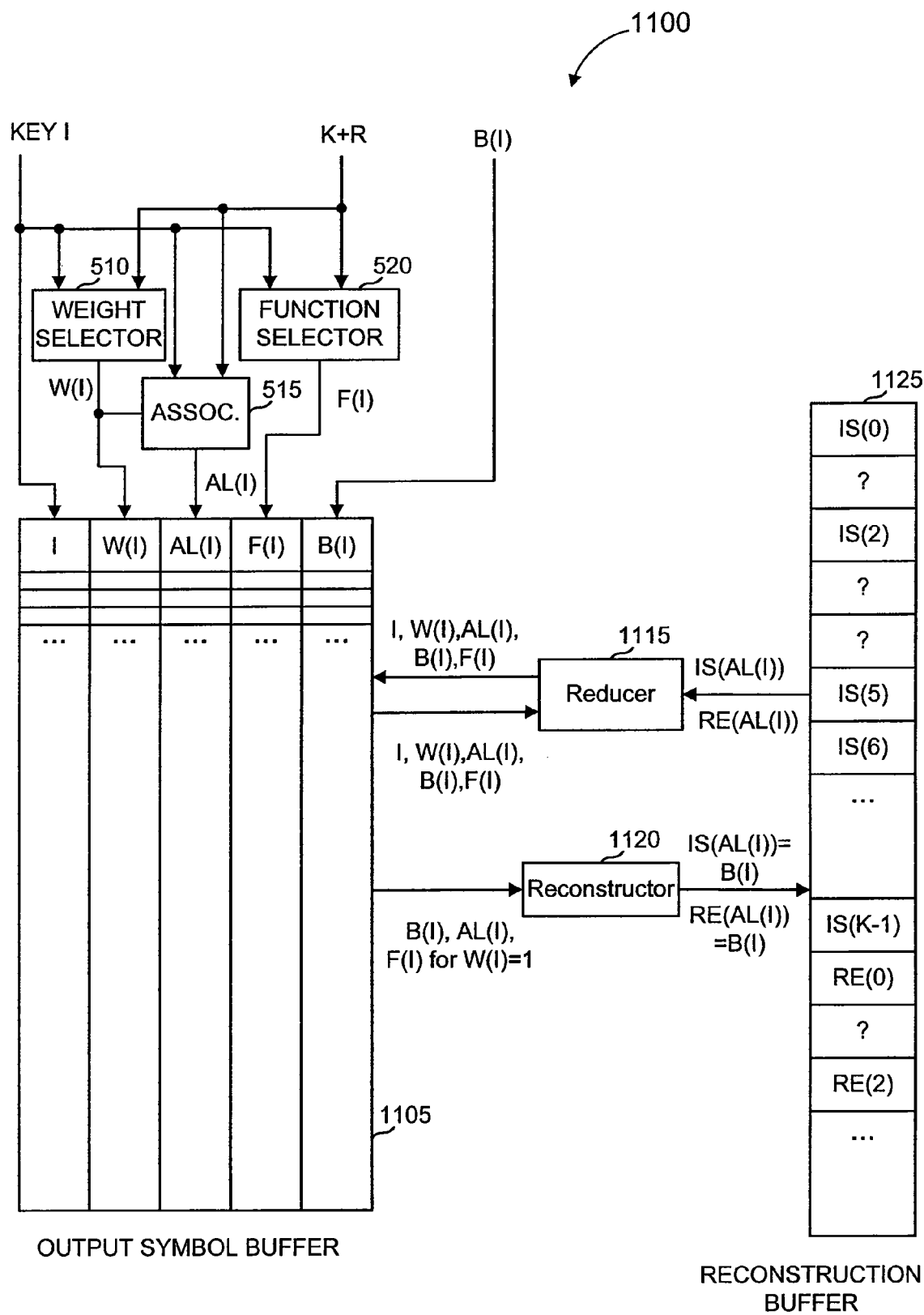
FIG. 15 is a simplified block diagram of a dynamic decoder according to one embodiment of the present invention.

FIG. 15 shows one embodiment of dynamic decoder according to the present invention. Dynamic decoder 1100 includes similar components as those of dynamic encoder 500 shown in FIG. 5. Decoder 1100 is similar to embodiments of chain reaction decoders described in Luby I and Luby II. Dynamic decoder 1100 comprises a weight selector 510, an associator 515, a value function selector 520, an output symbol buffer 1105, a reducer 1115, a reconstructor 1120 and a reconstruction buffer 1125. As with the encoder, value function selector 520 and the space in output symbol buffer 1105 allocated for storing the description of the value function are optional and might not be used if the value function was the same for all output symbols. Several entries of reconstruction buffer 1125 are shown, with some input symbols reconstructed and with others as yet unknown, indicated by question marks. For example, in FIG. 15, the input symbols at positions 0, 2, 5, 6, and K−1 and the redundant symbols at positions 0 and 2 have been recovered and the input symbols at positions 1, 3 and 4 and the redundant symbol at position 1 have yet to be recovered.

In operation, for each received output symbol with key I and value B(I), decoder 1100 does the following. Key I is provided to value function selector 520, weight selector 510 and associator 515. Using K+R, and dynamic key I, weight selector 510 determines weight W(I). Using K+R, dynamic key I, and W(I), associator 515 produces the list AL(I) of W(I) positions of input and redundant symbols associated with the output symbol. Optionally, using K+R and I, value function selector 520 selects value function F(I). Then, I, B(I), W(I) and AL(I), and optionally F(I), are stored in a row of output symbol buffer 1105. Value function selector 520, weight selector 510 and associator 515 perform the same operation for decoder 1105 as described for dynamic encoder 220 (FIG. 2). In particular, the value function F(I), the weight W(I) and the list AL(I) produced by value function selector 520, by weight selector 510 and associator 515 in FIG. 15 are the same for the same dynamic key I as for the corresponding parts shown in FIG. 5. If K and R vary from input file to input file, they can be communicated from the encoder to the decoder in any conventional manner, such as including it in a message header.

Reconstructor 1120 scans output symbol buffer 1105 looking for output symbols stored there that have weight one, i.e., W(I)=1 and AL(I) lists the position of just one associate. Those symbols are referred to herein as members of a "decodable set." For value functions with the properties described above, output symbols of weight one are in the decodable set because a value of a dynamic input symbol can be determined from that output symbol. Of course, if a value function were used that would allow dynamic input symbols to be decoded under a condition other than having a weight of one, that condition would be used to determine whether an output symbol is in the decodable set. For clarity, the examples described here assume that the decodable set is those output symbols with weight one, and extensions of these examples to other value function decodable conditions should be apparent from this description.

When reconstructor 1120 finds an output symbol that is in the decodable set, the output symbol's value B(I), and optionally the value function F(I), is used to reconstruct the dynamic input symbol listed in AL(I) and the reconstructed dynamic input symbol is placed into reconstruction buffer 1125 at the appropriate position for that input or redundant symbol. If the indicated input or redundant symbol had already been reconstructed, the reconstructor 1120 could drop the newly reconstructed dynamic input symbol, overwrite the existing reconstructed input or redundant symbol, or compare the two and issue an error if they differ. Where the value function is an XOR of all the associates, the input or redundant symbol value is simply the output symbol's value. Reconstructor 1120 thus reconstructs input and redundant symbols, but only from output symbols in the decodable set. Once an output symbol from the decodable set is used to reconstruct an input or redundant symbol it can be deleted to save space in output symbol buffer 1105. Deleting the "used up" output symbol also ensures that reconstructor 1120 does not continually revisit that output symbol.

Initially, reconstructor 1120 waits until at least one output symbol is received that is a member of the decodable set. Once that one output symbol is used, the decodable set would be empty again, except for the fact that some other output symbol might be a function of only that one reconstructed input or redundant symbol and one other input or redundant symbol. Thus, reconstructing one input or redundant symbol from a member of the decodable set might cause other output symbols to be added to the decodable set. The process of reduction of output symbols to add them to the decodable set is performed by reducer 1115.

Reducer 1115 scans output symbol buffer 1105 and reconstruction buffer 1125 to find output symbols that have lists AL(I) that list positions of input or redundant symbols that have been recovered. When reducer 1115 finds such a "reducible" output symbol with key I, reducer 1115 obtains the value IS(h) of a recovered dynamic input symbol at position h and modifies B(I), W(I) and AL(I) as follows:

B(I) is reset to B(I)⊕ IS(h)
W(I) is reset to W(I)−1
AL(I) is reset to AL(I) excluding h In the equations above, it is assumed that the value function was an XOR of all the associates' values. Note that XOR is its own inverse—if that were not the case and another value function was used originally to compute the output symbol, then the inverse of that value function would be used here by reducer 1115. As should be apparent, if the values for more than one associate are known, the equivalent of the above equations can be calculated to make B(I) dependent only on any unknown associate values (and adjust W(I) and L(I) accordingly).

The action of reducer 1115 reduces the weights of output symbols in output symbol buffer 1105. When an output symbol's weight is reduced to one (or other decodable condition occurs for other value functions), then that output symbol becomes a member of the decodable set, which can then be acted upon by reconstructor 1120. In practice, once a sufficient number of output symbols are received, reducer 1115 and reconstructor 1120 create a chain reaction decoding, with reconstructor 1120 decoding the decodable set to recover more dynamic input symbols, reducer 1115 using those freshly recovered input or redundant symbols to reduce more output symbols so they are added to the decodable set, and so on, until the decodable set is empty.

The decoder shown in FIG. 15 partially reconstructs input and redundant symbols in a straightforward manner, without much consideration to memory storage, computation cycles or transmission time. Where the decoder memory, decoding time or transmission time (which constrains the number of output symbols that are received) are limited, the decoder can be optimized to better use those limited resources. Examples of such optimizations are described, e.g., in Luby I and Luby II. Those optimizations can be used for dynamic decoding of multi-stage codes as well. Additionally, it is to be understood that other variations and equivalent decoders can be used.

Static Decoder

Figure 16:
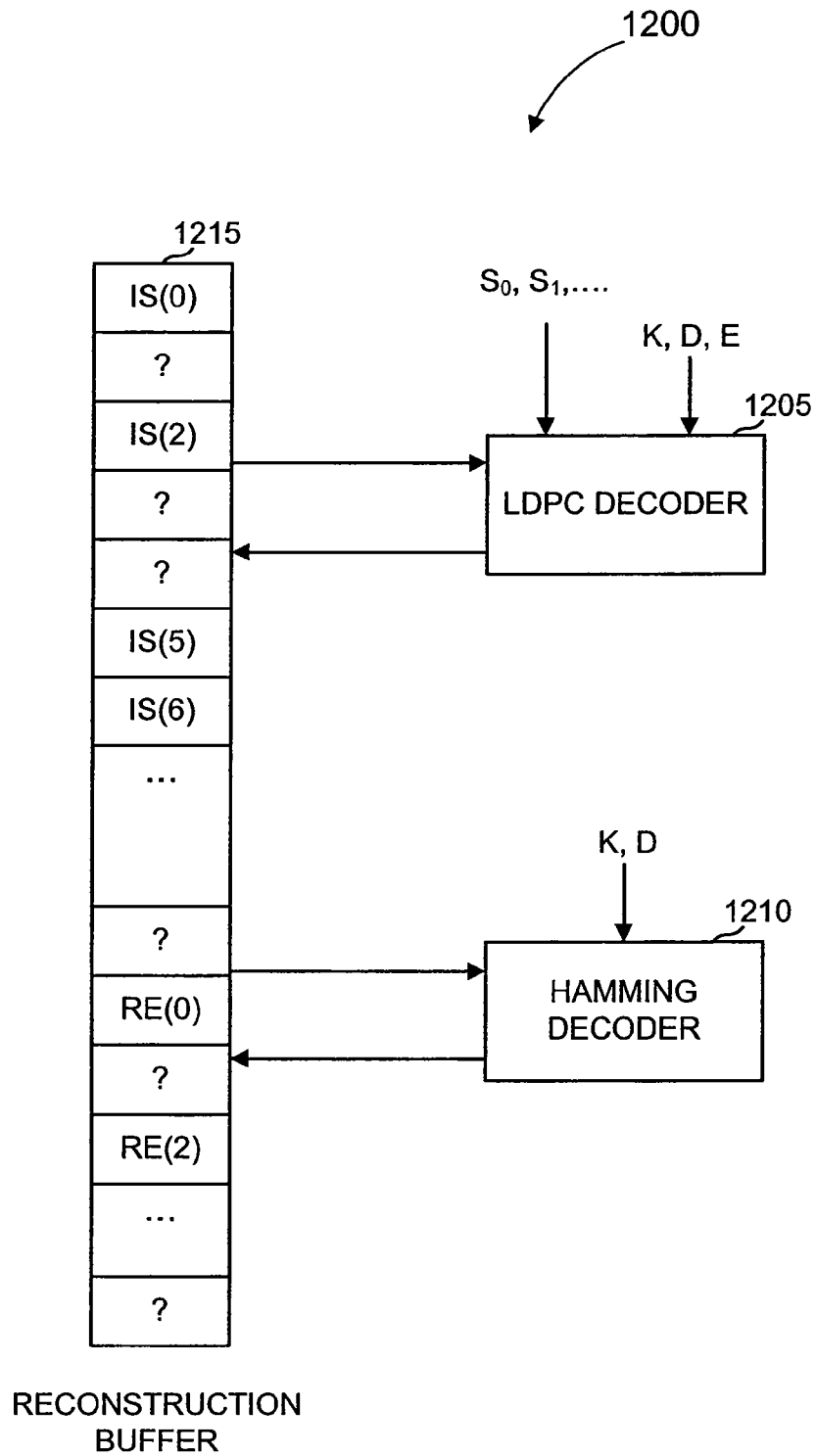
FIG. 16 is a simplified block diagram of a static decoder according to one embodiment of the present invention.

FIG. 16 is a simplified block diagram illustrating one embodiment of a static decoder. This embodiment can be used when the data is encoded with a static encoder such as described with reference to FIG. 7. Static decoder 1200 comprises a LDPC decoder 1205 and a Hamming decoder 1210. The LDPC decoder 1205 receives input symbols and redundant symbols from a reconstruction buffer 1215, and attempts to reconstruct those symbols of reconstruction buffer 1215 unrecovered after the decoding step of the dynamic decoder. In some embodiments, reconstruction buffer 1215 is reconstruction buffer 1125 (FIG. 15). LDPC decoder 1205 receives the static keys $S_0, S_1, \ldots$ generated by the static key generator 130. Additionally, LDPC decoder 1205 receives the number K of input symbols, the number D of redundant Hamming symbols, and the number E of redundant LDPC symbols. LDPC decoder 1205 recovers as many of the input and redundant symbols as possible in a manner well known to those skilled in the art, and writes those values into their corresponding positions in the reconstruction buffer 1215.

Hamming decoder 1210 is also coupled to receive input symbols and redundant symbols from the reconstruction buffer 1215. Additionally, Hamming decoder 1210 receives the number K of input symbols, and the number D, where D+1 is the number of redundant Hamming symbols. Hamming decoder 1210 attempts to recover those input symbols not recovered by the dynamic decoder and the LDPC decoder 1205. While the aim of LDPC decoder 1205 is to recover as many as possible input and redundant symbols, Hamming decoder 1210 only attempts to recover the input symbols IS(0), IS(1), ..., IS(K−1).

Many variations of LDPC decoders and Hamming decoders are well known to those skilled in the art, and can be employed in various embodiments according to the present invention. In one specific embodiment, Hamming decoder is implemented using a Gaussian elimination algorithm. Many variations of Gaussian elimination algorithms are well known to those skilled in the art, and can be employed in various embodiments according to the present invention.

In certain applications it may be more optimal to use a different type of decoder 155 shown in FIG. 1 than the one described above. For example, if the number K of input symbols is not very large, e.g., less than 1000, the variance involved in the probabilistic process of reception of output symbols may force decoder 155 to collect a number of output symbols that is significantly larger than K in order for the dynamic and the static decoder to correct the required number of erasures. In these cases, a different type of decoder can be used. An embodiment of such a decoder that decodes the data using Gaussian elimination will now be described with reference to FIGS. 17, 18 and 19.

First, referring again to FIG. 1, decoder 155 receives the output symbols $B(I_a), B(I_b), \ldots$ from receive module 150, the keys $I_a, I_b, \ldots$ from dynamic key regenerator 160, and the keys $S_0, S_1, \ldots$ from static key generator 130. Additionally, it receives the value K of input symbols and the value R of redundant symbols. Upon receiving this input, it attempts to reconstruct the input symbols IS(0), ..., IS(K−1), which are passed to input file reassembler 165 for further processing.

Figure 17:
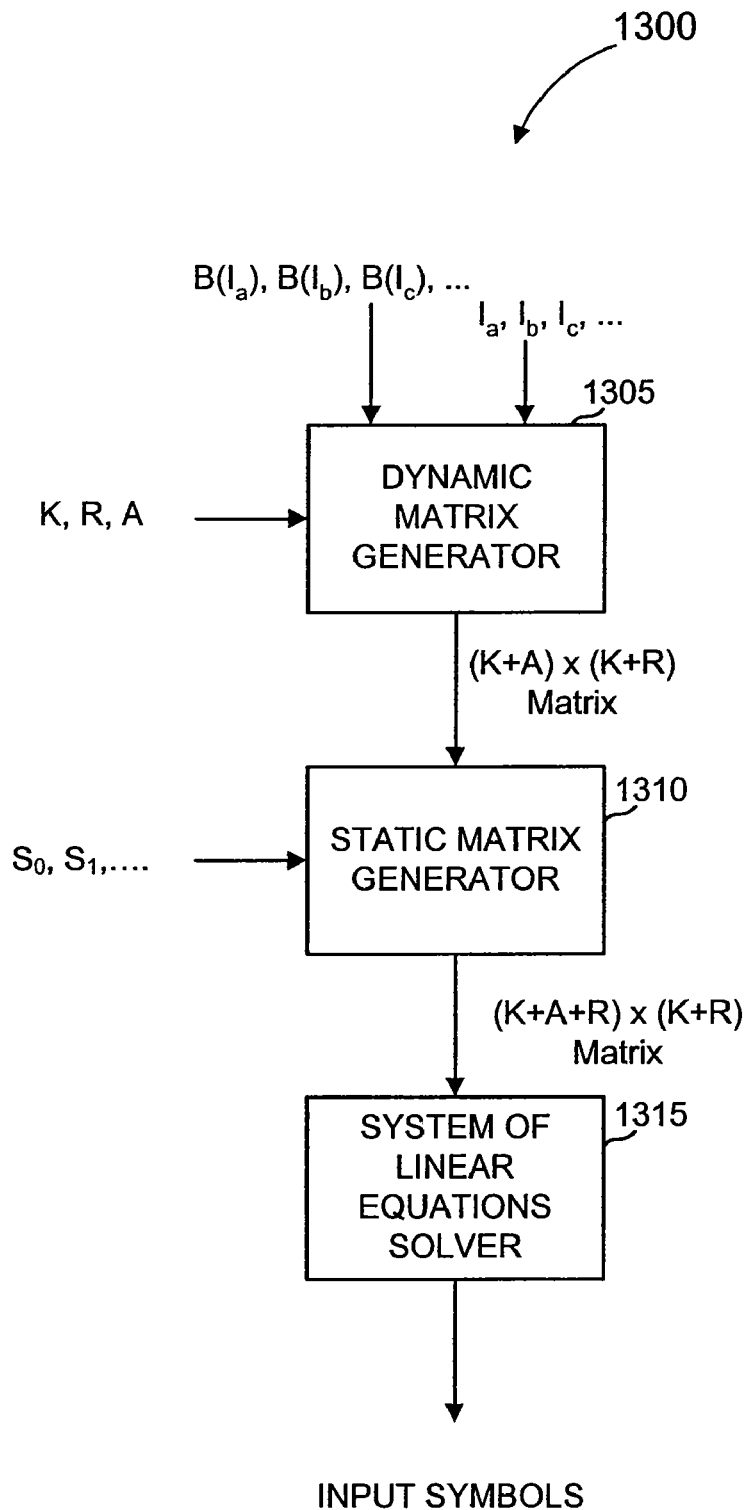
FIG. 17 is a simplified block diagram of a static decoder according to another embodiment of the present invention.

Referring now to FIG. 17, decoder 1300 comprises a dynamic matrix generator 1305 and a static matrix generator 1310. Dynamic matrix generator 1305 receives output symbols $B(I_a), B(I_b), \ldots$, dynamic keys $I_a, I_b, \ldots$, and the parameters K and R. Additionally, dynamic matrix generator 1305 receives another parameter A that describes how many output symbols should be collected (i.e., the number of output symbols collected is K+A). The determination of parameter A typically depends on the method used for dynamic and static encoding and will be described in more detail below. In the following description, the K+A output symbols collected will be referred to as B(0), B(1), ..., B(K+A−1). Upon reception of these parameters, a system of linear equations of the form $$C*\text{Transpose}(IS(0), \ldots, IS(K-1), RE(0), \ldots, RE(R-1)) = \text{Transpose}(B(0), \ldots, B(K+A-1))$$

is set up by dynamic matrix generator 1305 in which C is a matrix of format (K+A)×(K+R). Generation of matrix C by dynamic matrix generator 1305 will be described in further detail below.

Then, static matrix generator 1310 receives matrix C from dynamic matrix generator 1305, and uses the keys $S_0, S_1, \ldots$ to augment matrix C by R more rows to obtain a system of equations $$M*\text{Transpose}(IS(0), \ldots, IS(K-1), RE(0), \ldots, RE(R-1)) = \text{Transpose}(B(0), \ldots, B(K+A-1), 0, \ldots, 0),$$

wherein the last R entries of the right hand vector are zero, and wherein M is of format (K+A+R)×(K+R). Finally, a system of linear equations solver 1315 is employed to solve this system of equations M and to obtain some or all of the input symbols IS(0), ..., IS(K−1). In one specific embodiment, system of linear equations solver 1315 employs a Gaussian elimination algorithm to solve the system of linear equations.

Figure 18:
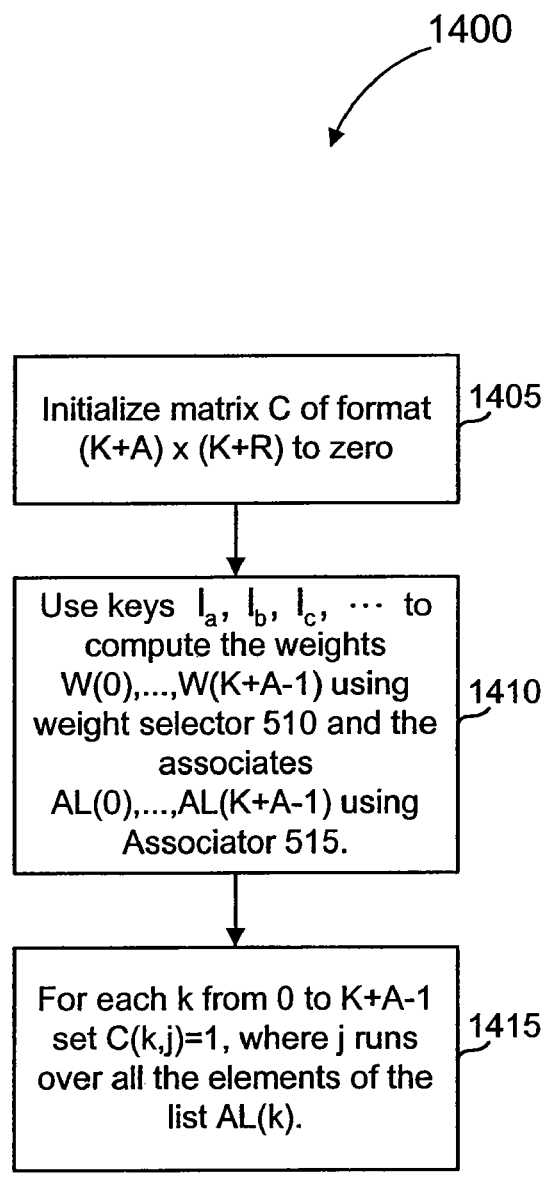
FIG. 18 is a simplified flow diagram of an operation of a decoder according to an embodiment of the present invention.

Dynamic matrix generator 1305 and static matrix generator 1310 will now be described in further detail with reference to dynamic encoder 500 of FIG. 5 and static encoder 210 in FIG. 2. FIG. 18 is a simplified flow diagram illustrating one embodiment of a method employed by dynamic matrix generator 1305. In step 1405, dynamic matrix generator 1205 initializes a matrix C of format (K+A)×(K+R) to all zeros. Next, in step 1410, the keys $I_a, I_b, \ldots$ are used in conjunction with weight selector 510 and associator 515 to generate the weights W(0), ..., W(K+A−1), and the lists AL(0), ..., AL(K+A−1), respectively. Each of the lists AL(k) comprises W(k) integers in the range 0, ..., K+R−1. In step 1415, these integers are used to compute C(k,1) with AL(k)=(a(0), ..., a(W(k)−1)) and entries C(k,a(0)), ..., C(k,a(W(k)−1)) are set to 1. As explained above, matrix C gives rise to a system of equations for the unknowns (IS(0), ..., IS(K−1), RE(0), ..., RE(R−1)) in terms of the received symbols (B(0), ..., B(K+A−1)). The reason is the following: once dynamic encoder chooses weight W(k) and associate list AL(k)=(a(0), ..., a(W(k)−1))), the corresponding output symbol B(k) is obtained as $$B(k) = L(a(0)) \oplus L(a(1)) \oplus \ldots \oplus L(a(W(k)-1)),$$

wherein L(j) denotes the unknown value of reconstruction buffer 1925 at position j. These equations, accumulated for all values of k between 0 and K+A−1, give rise to the desired system of equations.

Figure 19:
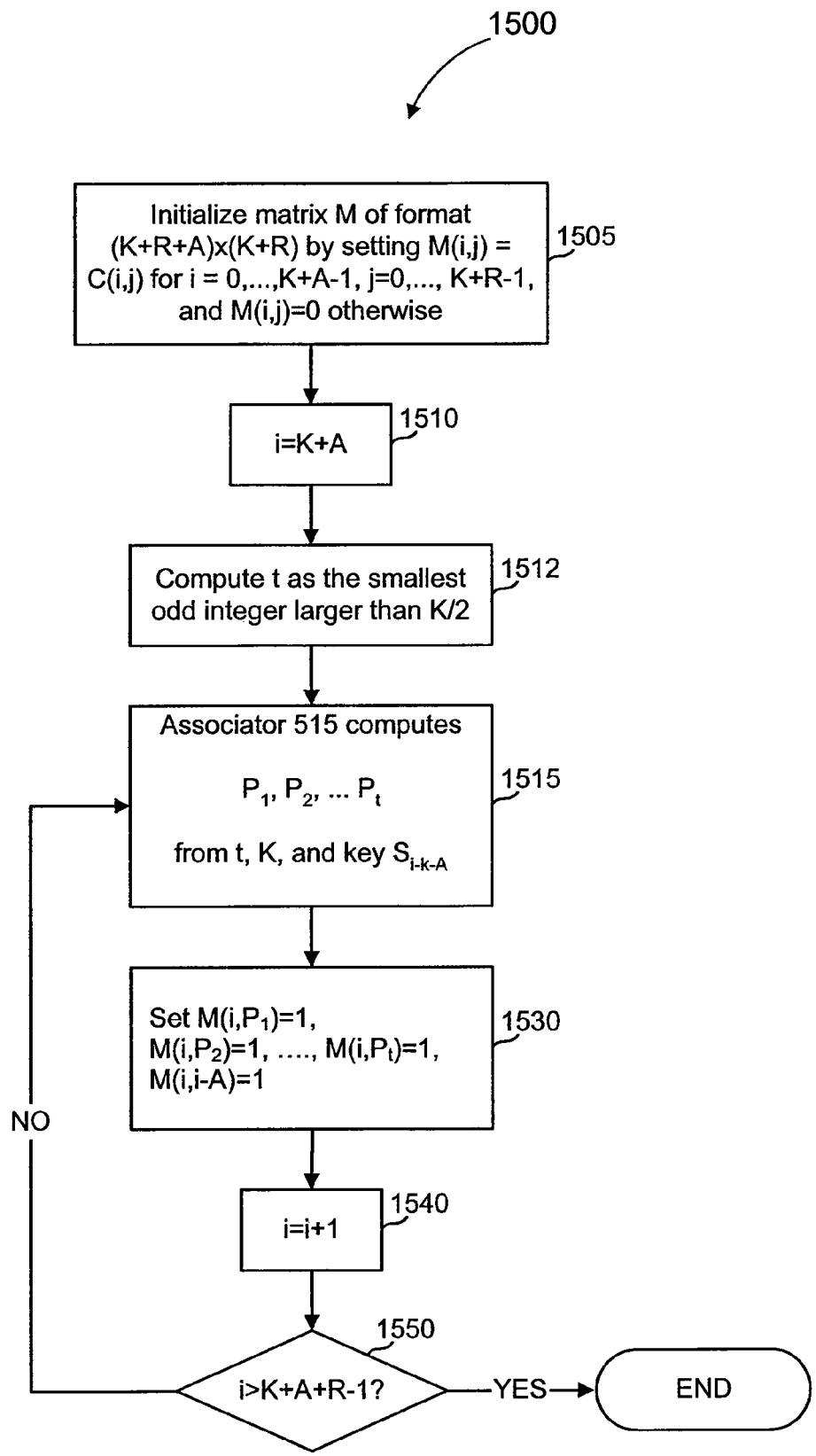
FIG. 19 is a simplified flow diagram of another operation of a decoder according to an embodiment of the present invention.

FIG. 19 is a simplified flow diagram illustrating one embodiment of a method employed by static matrix generator 1310. This embodiment will be described with reference to FIG. 10. In step 820 of FIG. 10, note that redundant symbol RE(i) is calculated as RE(i)=IS($P_1$)⊕ ... ⊕ IS($P_t$), and $P_1, P_2, \ldots, P_t$ are computed as in step 815 upon reception of key $S_i$. This means that IS($P_1$)⊕ ... ⊕ IS($P_t$) ⊕ RE(i)=0. Stated in terms of the positions of the reconstruction buffer, this means that L($P_1$)⊕ ... ⊕ L($P_t$)⊕ L(i+K)=0. Setting entries (i, $P_1$), ..., (i, $P_t$), (i, i−A) of M equal to 1, where i runs from K+A to K+A+R−1, a matrix M is obtained that describes a system of linear equations for the unknowns (IS(0), ..., IS(K−1), RE(0), ..., RE(R−1)) with respect to the received symbols B(0), ..., B(K+A−1), as described above.

In step 1505, matrix M of format (K+A+R)×(K+R) is initialized by letting the first K+A rows of M equal to the matrix C calculated by dynamic matrix generator 1305. The remaining rows of M are initialized to zero. Next, in step 1510, a variable i is initialized to K+A. This variable keeps track of the last R rows of M. In step 1512, the number t of associates of the redundant symbol i−K−A is computed. This step is similar to step 810 of FIG. 8. In particular, if another choice of t is preferred during the static encoding process given in FIG. 8, then this choice should be taken also for the variable t computed in step 1512. In step 1515, associator 515 computes indices $P_1, \ldots, P_t$ between 0 and K−1 from static key $S_i$, number of input symbols K, and the integer t. Then, the corresponding positions of the matrix M are set to 1 in step 1530. The increment in step 1540 and the test in step 1550 ensure that all the last R rows of M are visited and computed.

In some instances, the embodiment shown in FIGS. 17, 18 and 19 may be more optimal than other embodiments describe herein because it allows for collecting relatively fewer output symbols for successful decoding than other embodiments. The choice of the decoder depends to a large extent on the application, and, for example, whether or not the number of collected output symbols is a critical resource.

An Associator Implementation

Referring again to FIG. 5, one embodiment of associator 515 is described in Luby I. There, the number N should be a prime number. In operation, when this embodiment is used to compute AL(I), the input size K+R is adjusted so that it is prime. In the present invention, the number of redundant symbols is chosen large enough so that K+R is prime. In some applications, the condition that the input N is a prime is rather restrictive.

Figure 20:
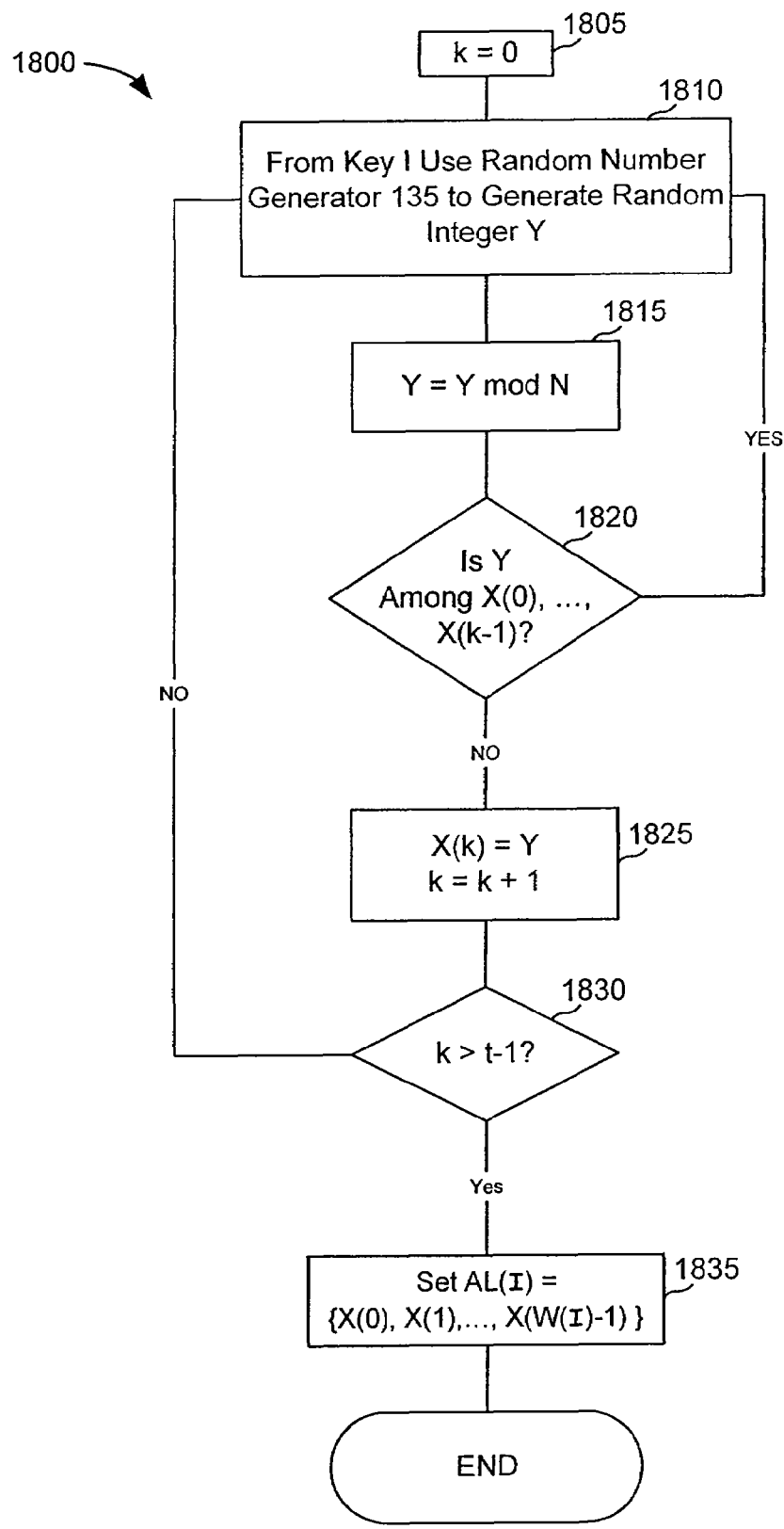
FIG. 20 is a simplified flow diagram of an associator according to one embodiment of the present invention.

Another embodiment of a method for implementing an associator 520 for which N need not be a prime number is shown in FIG. 20. First, in a step 1805, a variable k is initialized to zero. Then, in a step 1810, a random integer Y is generated. In one specific embodiment, the key I for the output symbol is used to seed a random number generator. Then, in step 1815, the integer Y is taken modulo the number N to produce a number between 0 and N−1. In step 1820, the candidate number Y is tested against other numbers Y previously generated (X(0), X(1), . . . ). If the number Y had been previously generated, then the flow returns to step 1810. Otherwise, in step 1825, it is included in a list X(0), X(1), . . . . Then, in step 1830, it is determined whether W(I) numbers have been generated. If not, then the flow returns to step 1810. The result of the flow illustrated in FIG. 20 is a list of W(I) numbers X(0), X(1), . . . , X(W(I)−1), where each number X in the list is a unique integer between 0 and N−1. Then, in a step 1835, the list AL(I) is set as the numbers X(0), X(1), . . . X(W(I)−1).

A Weight Selector Implementation

The performance and efficiency of the encoder/decoder is dependent on the distribution of weights of the output symbols generated by dynamic encoder 220 as shown in FIG. 2, and some distributions are better than others. In particular, the choice of the parameter A describing the excess of the number of collected output symbols compared to the number K of input symbols is primarily affected by the choice of the weight distribution. The operational aspects of weight selection are discussed below, followed by a description of some important weight distributions. The block diagram of FIG. 21 and the flow diagram of FIG. 22 are used to illustrate these concepts.

The task of weight selector 510 shown in FIG. 5 is the following: upon reception of a key I, and a length K+R, the weight selector outputs an integer W(I) in the range 0 through K+R−1, called the weight. Unlike associator 515, which ideally generates integers uniformly with a uniform random distribution, the output of the weight selector 510 is desirably not uniform but skewed in favor of certain weights, as is described below.

Figure 21:
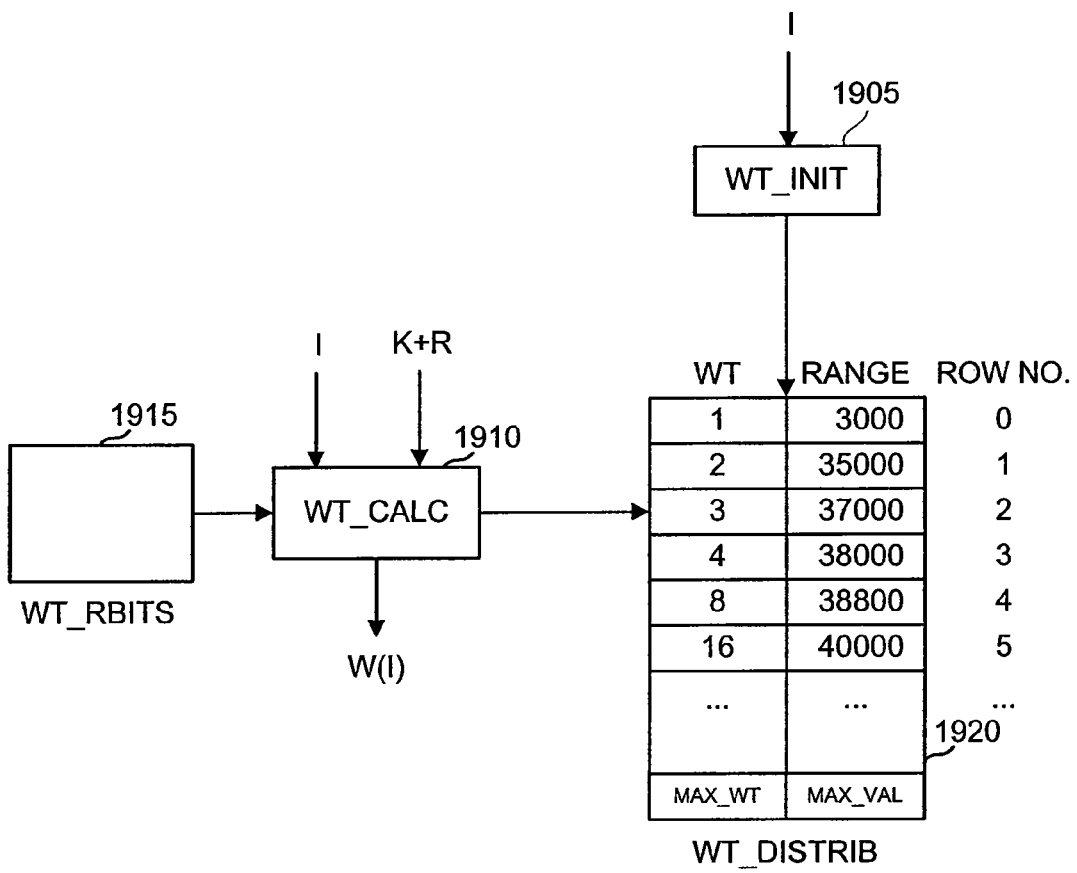
FIG. 21 is a simplified block diagram of a weight selector according to one specific embodiment of the present invention.
Figure 22:
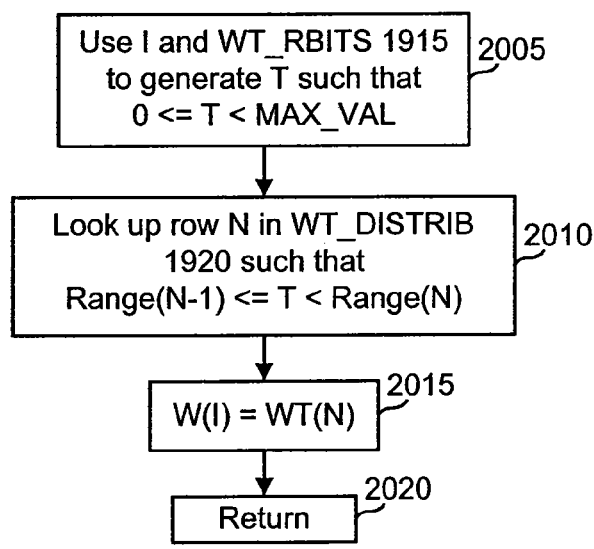
FIG. 22 is a simplified flow diagram of a process that can be used by a weight selector according to an embodiment of the present invention.

As shown in FIG. 21, weight selector 510 comprises two processes WT_INIT 1905 and WT_CALC 1910, and two tables WT_RBITS 1915 and WT_DISTRIB 1920. Process WT_INIT 1905 is invoked only once when the first key is passed in to initialize table WT_DISTRIB 1920. The design of WT_DISTRIB 1920 is an important aspect of the system, and is considered later in much more detail. Process WT_CALC 1910 is invoked on each call to produce a weight W(I) based on a key I. As shown in the flow diagram of FIG. 22, WT_CALC 1910 uses the key I and random bits stored in table WT_RBITS 1915 to generate a random number T (2005). Then, the value of T is used to select a row number N in table WT_DISTRIB 1920.

As shown in FIG. 21, the entries in the RANGE column of WT_DISTRIB 1920 are an increasing sequence of positive integers ending in the value MAX_VAL, and the WT column is an increasing sequence of positive integers ending in the value MAX_WT. The set of possible values for T are the integers between zero and MAX_VAL−1. A desirable property is that T is equally likely to be any value in the range of possible values. The value of N is determined by searching the RANGE column until an N is found that satisfies RANGE(N−1)≦T<RANGE(N) (2010). Once an N is found, the value of W(I) is set to WT(N), the N-th entry of the WT column of the table WT_DISTRIB, and this is the returned weight (2015, 2020). In FIG. 21 for the example table shown, if T is equal to 38,500, then N is found to be 4, and thus W(I) is set to WT(4)=8. In a preferred embodiment, the rows of WT-DIST 1920 are organized in such a way that RANGE(N)-RANGE(N−1) is decreasing in value as N increases. This minimizes the average search time through WT_DIST 1920 to find the weight corresponding to the value of T when a sequential search starting from the first row is used. In other embodiments other arrangements of the rows may be preferable, and other search methodologies can be employed, such as a binary search.

Selecting a Weight Distribution

A weight distribution should be selected for a given the coding process so that an input file can be fully reconstructed with: a) as few output symbols as possible, b) as few operations as possible, and c) as much reliability as possible. Typically, all these optimization criteria can be met by the right choice of the weight distribution for output symbols, i.e., the distribution of W(I) over all I, and the distribution of associates over the output symbols, i.e., the memberships of AL(I) over all I. It should be emphasized that while the decoding process can be applied regardless of the weight distribution and the distribution on the choice of the associates, the preferred embodiments will use weight distributions and distributions on the choice of associates specifically chosen for near optimal performance. In fact, many distributions will perform well, as small variations in the chosen distribution may lead to only small changes in performance.

One methodology for determining the distributions in one preferred embodiment will now be described. The actual weight distributions used depend on the number K of input symbols. The distributions are given below, together with a range ($K_{min}$, $K_{max}$), a factor β, and a relative overhead α. This has the following meaning: Given K with $K_{min} \leq K \leq K_{max}$, the number R of redundant symbols is calculated as the smallest integer greater than or equal to β*K; the number of output symbols collected should be at least (1+α)*K, i.e., parameter A described above is the smallest integer greater than or equal to α*K. In case the first version of the associator 520 is used, then R should additionally satisfy the condition that K+R is prime, i.e., R is the smallest prime number greater than or equal to β*K. If the application does not require the primality of K+R, then R can be chosen as the smallest integer greater than or equal to β*K.

The distributions themselves are given as a table of the form

| Weight 1 | P1 |
| Weight 2 | P2 |
| Weight 3 | P3 |
| ... | ... | where P1 is the corresponding probability of Weight 1, P2 is the corresponding probability of Weight 2, etc., and where the sum of P1, P2, ... is one. This means that the table WT_DISTRIB 1920 of FIG. 21 has the form

| Weight 1 | MAX_VAL * P1 |
| Weight 2 | MAX_VAL * (P1 + P2) |
| Weight 3 | MAX_VAL * (P1 + P2 + P3) |
| ... | ... |

General guidelines used in computing the tables herein will now be described. One goal of the design is to have a nonzero number of output symbols of reduced weight one as far into the dynamic decoding process as possible. Preferably, one would like for this number to be greater than zero all the way to the end of the dynamic decoding. However, a mathematical analysis shows that this is only possible if the average weight of an output symbol is at least proportional to the logarithm of the number K of input symbols, and this is how several of the weight distributions described in Luby I are designed. Some embodiments of the present invention significantly reduce this average weight to a fixed constant independent of K. As a result, the number of output symbols of reduced weight one cannot be expected to be larger than zero throughout the entire dynamic decoding process.

An initial step in the design of the weight distribution is obtaining an expression for the expected number of dynamic input symbols whose value could be obtained from output symbols currently in the decodable set during the dynamic decoding process when a fraction x of the dynamic input symbols have not yet been recovered. This expression is a function of the fractions P1, P2, ..., Pk of output symbols of weight 1, 2, ..., k, and of the ratio between the number of collected output symbols and the number of input and redundant symbols. In the following, we denote this ratio by γ. It is seen that γ=(1+α)/(1+β). A mathematical analysis of this quantity shows that the expected number of such dynamic input symbols can be represented as $$K*(1+\beta)*(x-e^{-(1+\gamma)*\omega(1-x)}) \quad (1)$$

where x denotes the fraction of dynamic input symbols that are not yet recovered during the dynamic decoding process, and ω(x) is the polynomial $$P1+2*P2*x+3*P3*x^2+\ldots+k*Pk*x^{k-1}. \quad (2)$$

Since this number is only the expectation of a quantity, which is statistical in nature, it is subject to variations. An analysis of this variation reveals that it is proportional to the square root of the expected number of input symbols not yet recovered, i.e., to the square root of x*K*(1+β). To have a reasonable guarantee that the number of input symbols that are neighbors of output symbols of reduced weight one is always positive, P1, ..., Pk and γ should be chosen in such a way that $$K*(1+\beta)*(x-e^{-(1+\gamma)*\omega(1-x)}) > c*\text{sqrt}(x*K*(1+\beta)), \quad (3)$$

wherein this inequality should hold for all values of x between a given positive real number ε and 1, and c is a positive real number larger than one. The larger c is, the better the guarantee on the success of the decoding process. The smaller is, the fewer unrecovered input symbols there are at the end of the dynamic decoding process. The smaller ω(1) is, the smaller is the average weight of an output symbol. Given these constraints one can compute for a given ε and a given c a polynomial ω(x) in which all the coefficients are nonnegative, which satisfies the above inequality for all values of x between ε and 1, and for which ω(1) is as small as possible. This optimization can be done by a variety of methods, for example using the simplex algorithm after a suitable manipulation of the above inequality.

The actual tables are now given with reference to the above description. The constant c in the above description was chosen to guarantee that the error probability for the overall decoder be less than $10^{-10}$. For K>49251 the error probability is less than $10^{-12}$. These tables are provided merely as examples of weight distributions that can be used. It is to be understood that other weight distributions can also be used.

TABLE 1

| Range for K: 9900-14800, β = 0.0081, α = 0.1187 | |
| --- | --- |
| 1 | 0.018235 |
| 2 | 0.477562 |
| 3 | 0.153565 |
| 4 | 0.102006 |
| 5 | 0.034651 |
| 7 | 0.048352 |
| 8 | 0.06084 |
| 18 | 0.058325 |
| 19 | 0.008401 |
| 70 | 0.008451 |
| 71 | 0.029613 |

TABLE 2

| Range for K: 14801-19680, β = 0.0121, α = 0.084 | |
| --- | --- |
| 1 | 0.019314 |
| 2 | 0.483582 |
| 3 | 0.160754 |
| 4 | 0.081631 |
| 5 | 0.067541 |
| 8 | 0.094528 |
| 18 | 0.041968 |
| 19 | 0.019462 |
| 66 | 0.007987 |
| 67 | 0.023233 |

TABLE 3

| Range for K: 19681-29510, β = 0.0151, α = 0.0769 | |
| --- | --- |
| 1 | 0.013531 |
| 2 | 0.488250 |
| 3 | 0.164810 |
| 4 | 0.070953 |
| 5 | 0.084243 |
| 8 | 0.050093 |
| 9 | 0.042547 |
| 19 | 0.055060 |
| 62 | 0.00501988 |
| 63 | 0.025491 |

TABLE 4

Range for K: 29511-49250, β = 0.0161, α = 0.0674

| | |
|---|---|
| 1 | 0.013876 |
| 2 | 0.489087 |
| 3 | 0.162276 |
| 4 | 0.081638 |
| 5 | 0.069880 |
| 8 | 0.081339 |
| 9 | 0.014424 |
| 18 | 0.017712 |
| 19 | 0.040774 |
| 66 | 0.014680 |
| 67 | 0.014314 |

TABLE 5

Range for K: 49251-64780, β = 0.015, α = 0.0558

| | |
|---|---|
| 1 | 0.009117 |
| 2 | 0.492843 |
| 3 | 0.165983 |
| 4 | 0.072707 |
| 5 | 0.082303 |
| 8 | 0.056347 |
| 9 | 0.036917 |
| 19 | 0.055616 |
| 65 | 0.022195 |
| 66 | 0.005972 |

TABLE 6

Range K: 64781-79080, β = 0.0114, α = 0.05

| | |
|---|---|
| 1 | 0.007969 |
| 2 | 0.493570 |
| 3 | 0.166220 |
| 4 | 0.072646 |
| 5 | 0.082558 |
| 8 | 0.056058 |
| 9 | 0.037229 |
| 19 | 0.055590 |
| 65 | 0.025023 |
| 66 | 0.003135 |

TABLE 7

Range for K: 79081-98623, β = 0.01134, α = 0.047

| | |
|---|---|
| 1 | 0.007544 |
| 2 | 0.49361 |
| 3 | 0.166458 |
| 4 | 0.071243 |
| 5 | 0.084913 |
| 8 | 0.049633 |
| 9 | 0.043365 |
| 19 | 0.045231 |
| 20 | 0.010157 |
| 66 | 0.010479 |
| 67 | 0.017365 |

TABLE 8

Range for K: 98624-118349, β = 0.01377, α = 0.0424

| | |
|---|---|
| 1 | 0.006495 |
| 2 | 0.495044 |
| 3 | 0.168010 |
| 4 | 0.067900 |
| 5 | 0.089209 |
| 8 | 0.041731 |

TABLE 8-continued

Range for K: 98624-118349, β = 0.01377, α = 0.0424

| | |
|---|---|
| 9 | 0.050162 |
| 19 | 0.038837 |
| 20 | 0.015537 |
| 66 | 0.016298 |
| 67 | 0.010777 |

TABLE 9

Range for K: 118350-∞, β = 0.01579, α = 0.0393

| | |
|---|---|
| 1 | 0.004807 |
| 2 | 0.496472 |
| 3 | 0.166912 |
| 4 | 0.073374 |
| 5 | 0.082206 |
| 8 | 0.057471 |
| 9 | 0.035951 |
| 18 | 0.001167 |
| 19 | 0.054305 |
| 65 | 0.018235 |
| 66 | 0.009100 |

For example, if K=33,000, then the number of redundant symbols could be the smallest integer R greater than K*0.0161=531.3 such that K+R is a prime. That is, R=533. The number of output symbols collected should be at least (1+0.0674)*K which is 35225.

The average weight for Table 1 is around 6.75, and the average weight for Tables 2 through 9 is around 6. These average weights are significantly lower as compared with one embodiment of Luby I described previously where the average weight is 28.68 when K is 60,000.

Coding for Few Input Symbols

Low relative overhead is preferred for an input file of any size. As is seen from the tables above, as the number K of input symbols becomes smaller, the relative overhead α grows. For example, if the input file has 10,000 bytes, and K is chosen to be 10,000 so that each symbol comprises one byte, then the overhead is roughly 11%, which is not desirable for some applications. One way to reduce the overhead would be to increase the number of input symbols K, at the expense of decreasing the size of the input symbols. For example, where an overhead of about 7% is desired, K could be chosen to be 40,000. In this case, the size of the input symbols would be 2 bits. Using input symbols of very small size, however, leads to computational deficiencies in practice.

A solution to this problem is to use a decoder based on Gaussian elimination, such as the embodiment described with respect to FIG. 17. Even though this decoder is not as computationally efficient as the chain reaction decoder combined with any static encoders described above with respect to the other embodiments, the overhead in combination with very small failure probabilities for the decoder may make this solution desirable in certain applications.

Specifically, when the number K of input symbols is between 800 and 9899, the following weight distribution can be used for dynamic encoder 220:

TABLE 10

Range for K: 800-1600, β = 0.08, α = 0.05

| | |
|---|---|
| 2 | 0.39 |
| 3 | 0.095 |

TABLE 10-continued

Range for K: 800-1600, $\beta = 0.08$, $\alpha = 0.05$

| | |
|---|---|
| 4 | 0.095 |
| 5 | 0.095 |
| 10 | 0.095 |
| 19 | 0.095 |
| 30 | 0.095 |
| 130 | 0.04 |

The 0.08*K redundant symbols are to be generated according to the operation of static encoder such as that describe with respect to FIG. 10. Decoding is done using a decoder such as that described with respect to FIG. 17.

As an example, suppose that an input file has a size of 16,000 bytes. Input symbols are chosen so that they comprise 16 bytes each, so that the number K of input symbols is 1000. Static encoder in FIG. 10 is used to create 80 redundant symbols. Next, dynamic encoder 220 is used together with the above weight distribution to generate output symbols. The receiver collects $(1+\alpha)*K=1050$ output symbols and provides them to decoder of FIG. 17. Dynamic matrix generator 1305 creates matrix C of format 1050×1080. Static matrix generator 1330 creates a matrix M of format 1130×1080 and hands it off to the system of linear equation solver 1340, which attempts to decode the original 1000 input symbols, i.e., the input file.

Some Properties of Some Multi-Stage Codes

In most of the examples described above, the input and output symbols encode for the same number of bits and each output symbol is placed in one packet (a packet being a unit of transport that is either received in its entirety or lost in its entirety). In some embodiments, the communications system is modified so that each packet contains several output symbols. The size of an output symbol value is then set to a size determined by the size of the input symbol values in the initial splitting of the file into input symbols, based on a number of factors. The decoding process remains essentially unchanged, except that output symbols arrive in bunches as each packet is received.

The setting of input symbol and output symbol sizes is usually dictated by the size of the file and the communication system over which the output symbols are to be transmitted. For example, if a communication system groups bits of data into packets of a defined size or groups bits in other ways, the design of symbol sizes begins with the packet or grouping size. From there, a designer would determine how many output symbols will be carried in one packet or group and that determines the output symbol size. For simplicity, the designer would likely set the input symbol size equal to the output symbol size, but if the input data makes a different input symbol size more convenient, it can be used.

The above-described encoding process produces a stream of packets containing output symbols based on the original file. Each output symbol in the stream is generated independently of all other output symbols, and there is no lower or upper bound on the number of output symbols that can be created. A key is associated with each output symbol. That key, and some contents of the input file, determines the value of the output symbol. Consecutively generated output symbols need not have consecutive keys, and in some applications it would be preferable to randomly generate the sequence of keys, or pseudorandomly generate the sequence.

Multi-stage decoding has a property that if the original file can be split into K equal-sized input symbols and each output symbol value is the same length as an input symbol value, then the file can be recovered from K+A output symbols on average, with very high probability, where A is small compared to K. For example, for the weight distributions introduced above, the probability that the value of A exceeds $\alpha*K$ is at most $10^{-12}$ if K is larger than 19,681, and it is at most $10^{-10}$ for any value of K. Since the particular output symbols are generated in a random or pseudorandom order, and the loss of particular output symbols in transit is assumed random, some small variance exists in the actual number of output symbols needed to recover the input file. In some cases, where a particular collection of K+A packets are not enough to decode the entire input file, the input file is still recoverable if the receiver can gather more packets from one or more sources of output packets.

Because the number of output symbols is only limited by the resolution of I, well more than K+A output symbols can be generated. For example, if I is a 32-bit number, 4 billion different output symbols could be generated, whereas the file could include K=50,000 input symbols. In some applications, only a small number of those 4 billion output symbols may be generated and transmitted and it is a near certainty that an input file can be recovered with a very small fraction of the possible output symbols and an excellent probability that the input file can be recovered with slightly more than K output symbols (assuming that the input symbol size is the same as the output symbol size).

In some applications, it may be acceptable to not be able to decode all of the input symbols, or to be able to decode all of input symbols, but with a relatively low probability. In such applications, a receiver can stop attempting to decode all of the input symbols after receiving K+A output symbols. Or, the receiver can stop receiving output symbols after receiving less than K+A output symbols. In some applications, the receiver may even only receive K or less output symbols. Thus, it is to be understood that in some embodiments of the present invention, the desired degree of accuracy need not be complete recovery of all the input symbols.

Further, in some applications where incomplete recovery is acceptable, the data can be encoded such that all of the input symbols cannot be recovered, or such that complete recovery of the input symbols would require reception of many more output symbols than the number of input symbols. Such an encoding would generally require less computational expense, and may thus be an acceptable way to decrease the computational expense of encoding.

It is to be understood that the various functional blocks in the above-described figures may be implemented by a combination of hardware and/or software, and that in specific implementations some or all of the functionality of some of the blocks may be combined. Similarly, it is also to be understood that the various methods described herein may be implemented by a combination of hardware and/or software.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A decoder for decoding output symbols received over a communications channel wherein the output symbols represent data sent by one or more transmitters, the decoder comprising:

a receiver input for receiving output symbols, wherein the encoded output symbols can be received in an order independent of the order of encoded output symbols previously received;

memory for storing output symbols received at the receiver input;

a key generator that generates corresponding keys for the received output symbols by extracting or deducing keys from the particular output symbols received, if corresponding keys are not already available to the decoder;

dynamic decoder logic that decodes, from at least some of the received output symbols and their corresponding keys, to recover a first set of input symbols and at least some redundant symbols used in the creation of a first subset of the encoded output symbols, the dynamic decoder being dynamic in that it can decode symbols generated by an encoder where the number of possible output symbols is independent of the number of input symbols encoding the data sent by the one or more transmitters; and static decoder logic that decodes, from at least some of the redundant symbols, additional input symbols not decoded by the dynamic decoder logic, to recover a second set of input symbols used in the creation of a second subset of the encoded output symbols that were not decoded by the dynamic decoder logic.

2. The decoder of claim 1, wherein the dynamic decoder logic and the static decoder logic operate in an interleaved manner such that neither need wait for the other to complete before starting a decode.

3. The decoder of claim 1, wherein the number of the encoded output symbols decoded is dependent on a desired degree of accuracy to which the static decoder logic and dynamic decoder logic can recover input symbols that were used to generate the encoded output symbols.

4. The decoder of claim 1, wherein decoding at least some of the encoded output symbols using the dynamic decoder logic comprises labeling the encoded output symbols having a weight of one as being part of a decodable set of the encoded output symbols and wherein the dynamic decoder logic includes logic to reduce the set of encoded output symbols having a weight of two or more by decoding the decodable set of encoded output symbols.

5. The decoder of claim 4, wherein the dynamic decoder logic comprises a chain reaction decoder.

6. A method of encoding data for transmission from a source to a destination over a communications channel, the method comprising:

generating a plurality of redundant symbols from an ordered set of input symbols to be transmitted; and generating a plurality of output symbols from a combined set of symbols including the input symbols and the redundant symbols, wherein the number of possible output symbols is independent of the number of symbols in the combined set of symbols, each output symbol having a weight representing the number of symbols from the combined set of symbols used to generate that output symbol.

7. The method of claim 6, wherein the weights of the output symbols in the plurality of output symbols are distributed in a way to minimize the number of output symbols or the number of operations needed to regenerate the ordered set of input symbols.

8. The method of claim 6, wherein the weights of the plurality of output symbols are distributed among the output symbols so that the input symbols can be decoded as reliably as possible.

9. The method of claim 6, wherein each redundant symbol is associated with a static key and wherein each redundant symbol is generated by a function determined at least in part by the static key associated with the redundant symbol.

10. A method of decoding output symbols transmitted over a communications channel, the method comprising:

(i) receiving a plurality of encoded output symbols and corresponding keys from the communications channel, wherein the encoded output symbols can be received in an order independent of the order of encoded output symbols previously received;

(ii) decoding at least some of the encoded output symbols using a dynamic decoder and the corresponding keys to recover a first set of input symbols and at least some redundant symbols used in the creation of a first subset of the encoded output symbols;

(iii) determining whether the decoding process is complete; and (iv) if the decoding process is not complete, decoding at least some of the encoded output symbols using a static decoder to recover a second set of input symbols used in the creation of a second subset of the encoded output symbols that were not decoded by the dynamic decoder.

11. The method of claim 10, wherein the plurality of encoded output symbols received is equal to Q, wherein Q is a function of one or more of (a) the number of input symbols, (b) decoder methods used to decode the output symbols, and (c) a desired degree of accuracy of the recovery of input symbols.

12. The method of claim 10, wherein the determination made at step (iii) is made based at least in part on the degree of accuracy achieved of the recovery of input symbols.

13. The method of claim 10, wherein the determination made at step (iii) is made based at least in part on one or more of (a) the number of output symbols processed, (b) a rate at which input symbols are being recovered, and (c) time spent processing output symbols.

14. The method of claim 10 wherein the plurality of encoded output symbols received over the communications channel are received from more than one transmitter, wherein each transmitter transmits output symbols independently from other transmitters.

15. The method of claim 10 wherein the plurality of encoded output symbols received over the communications channel are received from more than one transmitter, wherein each transmitter transmits output symbols independently from other transmitters.

16. A computer-readable medium for use with electronics capable of executing instructions read from the computer-readable medium in order to implement encoding data for transmission from a transmitter to at least one receiver over a communication channel, the computer-readable medium having stored thereon:

program code for generating, during a first encoding stage, a plurality of redundant symbols from an ordered set of input symbols representing the data to be encoded for transmission;

program code for generating, during a second encoding stage, a set of output symbols derived from a combination of the plurality of redundant symbols and the ordered set of input symbols, wherein the number of possible output symbols that could be generated is independent of the number of input symbols in the ordered set of input symbols; and program code for transmitting at least some of the set of output symbols over the communications channel to the at least one receiver such that the ordered set of input symbols can be regenerated to a desired degree of accuracy from a predetermined number of output symbols received by the at least one receiver.

17. The computer-readable medium of claim 16, wherein the program code for generating the plurality of redundant symbols includes program code for implementing a static encoder having one or more of a Reed-Solomon encoder, a Tornado encoder, a Hamming encoder, or a Low Density Parity Check (LDPC) encoder.

18. The computer-readable medium of claim 16, wherein the program code for generating the set of output symbols includes program code for implementing a chain reaction encoder.

19. The computer-readable medium of claim 16, wherein the program code for generating the plurality of redundant symbols comprises program code for computing a number, R, of the redundant symbols from a number, K, of input symbols, wherein R and K are known in advance and K/(R+K) is a code rate of a static code used in the generating.

20. A computer-readable medium for use with electronics capable of executing instructions read from the computer-readable medium in order to implement decoding output symbols transmitted over a communications channel, the computer-readable medium having stored thereon:
 program code for receiving a plurality of encoded output symbols and corresponding keys from the communications channel, including program code for handling encoded output symbols if they are received in an order independent of the order of encoded output symbols previously received;
 program code for decoding at least some of the encoded output symbols using a dynamic decoder and the corresponding keys to recover a first set of input symbols and at least some redundant symbols used in the creation of a first subset of the encoded output symbols; and
 program code for decoding at least some of the encoded output symbols using a static decoder to recover a second set of input symbols used in the creation of a second subset of the encoded output symbols that were not decoded by the dynamic decoder.

21. The computer-readable medium of claim 20, wherein the program code is configured to process encoded output symbols that are generated from an ordered set of input symbols wherein the number of the ordered set of input symbols used to generate the encoded output symbols is independent of the number of possible encoded output symbols.

22. The computer-readable medium of claim 20, comprising program code for dynamic decoding and program code for static decoding that is capable of operating in an interleaved manner such that neither need wait for the other to complete before starting a decode.

23. The computer-readable medium of claim 20, further comprising program code for labeling the encoded output symbols having a weight of one as being part of a decodable set of the encoded output symbols and program code for reducing the set of encoded output symbols having a weight of two or more by decoding the decodable set of encoded output symbols.

24. The computer-readable medium of claim 20, comprising program code implementing wherein a chain reaction decoder.

* * * * *